United States Patent
Chi et al.

(10) Patent No.: US 9,577,063 B2
(45) Date of Patent: Feb. 21, 2017

(54) BIPOLAR TRANSISTOR, BAND-GAP REFERENCE CIRCUIT AND VIRTUAL GROUND REFERENCE CIRCUIT AND METHODS OF FABRICATING THEREOF

(71) Applicant: Semiconductor Manufacturing International (Beijing) Corporation, Beijing (CN)

(72) Inventors: Min-Hwa Chi, Shanghai (CN); Lihying Ching, Shanghai (CN); Deyuan Xiao, Shanghai (CN)

(73) Assignee: SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/088,961

(22) Filed: Apr. 1, 2016

(65) Prior Publication Data

US 2016/0218194 A1 Jul. 28, 2016

Related U.S. Application Data

(60) Division of application No. 14/463,583, filed on Aug. 19, 2014, now Pat. No. 9,337,324, which is a
(Continued)

(30) Foreign Application Priority Data

Jul. 24, 2009 (CN) .......................... 2009 1 0055408
Jul. 24, 2009 (CN) .......................... 2009 1 0055410

(51) Int. Cl.
*H01L 29/66* (2006.01)
*G05F 3/30* (2006.01)
(Continued)

(52) U.S. Cl.
CPC ........... *H01L 29/66325* (2013.01); *G05F 3/30* (2013.01); *H01L 21/26586* (2013.01);
(Continued)

(58) Field of Classification Search
CPC ........... H01L 29/66325; H01L 29/1095; H01L 29/063; H01L 29/0649; H01L 29/1008; H01L 29/0808; H01L 29/0821; H01L 29/7393; H01L 29/7317; H01L 29/66265; H01L 21/26586; H01L 21/8228; H01L 27/1203; H03K 17/60; G05F 3/30
See application file for complete search history.

(56) References Cited

U.S. PATENT DOCUMENTS 5,027,177 A * 6/1991 Vasudev ............. H01L 27/1443
257/131
5,298,786 A 3/1994 Shahidi et al.
(Continued)

FOREIGN PATENT DOCUMENTS

JP 2001203274 A 7/2001
WO 2006109211 A1 10/2006

*Primary Examiner* — Minh-Loan Tran
*Assistant Examiner* — Farid Khan
(74) *Attorney, Agent, or Firm* — Anova Law Group, PLLC

(57) ABSTRACT

The present invention provides a bipolar transistor, a method for forming the bipolar transistor, a method for turning on the bipolar transistor, and a band-gap reference circuit, virtual ground reference circuit and double band-gap reference circuit with the bipolar transistor. The bipolar transistor includes: a Silicon-On-Insulator wafer; a base area, an emitter area and a collector area; a base area gate dielectric layer on a top silicon layer and atop the base area; a base area control-gate on the base area gate dielectric layer; an emitter electrode connected to the emitter area via a first contact; a collector electrode connected to the collector area via a second contact; and a base area control-gate electrode con-
(Continued)

nected to the base area control-gate via a third contact. Processes of forming the bipolar transistor are fully compatible with traditional standard CMOS processes; and the base current to turn on the bipolar transistor is based on the GIDL current and formed by applying a voltage to the base area control-gate electrode without any need of contact to the base.

16 Claims, 12 Drawing Sheets

Related U.S. Application Data continuation of application No. 12/842,903, filed on Jul. 23, 2010, now abandoned.

(51) Int. Cl.
| | |
|---|---|
| H01L 21/8228 | (2006.01) |
| H01L 21/84 | (2006.01) |
| H01L 27/082 | (2006.01) |
| H01L 27/12 | (2006.01) |
| H01L 29/73 | (2006.01) |
| H01L 21/265 | (2006.01) |
| H01L 29/08 | (2006.01) |
| H01L 29/10 | (2006.01) |
| H01L 29/739 | (2006.01) |
| H03K 17/60 | (2006.01) |
| H01L 29/06 | (2006.01) |

(52) U.S. Cl.
CPC .......... *H01L 21/8228* (2013.01); *H01L 21/84* (2013.01); *H01L 27/082* (2013.01); *H01L 27/1203* (2013.01); *H01L 29/063* (2013.01); *H01L 29/0649* (2013.01); *H01L 29/0808* (2013.01); *H01L 29/0821* (2013.01); *H01L 29/1008* (2013.01); *H01L 29/1095* (2013.01); *H01L 29/66265* (2013.01); *H01L 29/7317* (2013.01); *H01L 29/7393* (2013.01); *H03K 17/60* (2013.01)

(56) References Cited

U.S. PATENT DOCUMENTS

| | | | | |
|---|---|---|---|---|
| 5,567,631 | A * | 10/1996 | Hsu | H01L 21/8249 148/DIG. 9 |
| 5,610,087 | A | 3/1997 | Hsu et al. | |
| 5,705,839 | A * | 1/1998 | Hsu | H01L 21/8249 257/336 |
| 5,717,241 | A * | 2/1998 | Malhi | H01L 27/0722 257/273 |
| 5,728,613 | A * | 3/1998 | Hsu | H01L 21/8249 257/E21.372 |
| 6,127,236 | A * | 10/2000 | Prall | H01L 21/8222 257/E21.373 |
| 6,246,103 | B1 * | 6/2001 | Yu | H01L 29/7311 257/557 |
| 6,255,713 | B1 * | 7/2001 | Chi | H01L 27/0716 257/526 |
| 6,376,880 | B1 | 4/2002 | Holst | |
| 2002/0113266 | A1 * | 8/2002 | Ebina | H01L 29/7317 257/350 |
| 2006/0060941 | A1 | 3/2006 | Sun et al. | |
| 2007/0096152 | A1 | 5/2007 | Rahim | |
| 2009/0022003 | A1 | 1/2009 | Song et al. | |
| 2010/0213504 | A1 * | 8/2010 | Ko | H01L 21/8249 257/139 |
| 2010/0252860 | A1 | 10/2010 | Yang et al. | |

\* cited by examiner

BIPOLAR TRANSISTOR, BAND-GAP REFERENCE CIRCUIT AND VIRTUAL GROUND REFERENCE CIRCUIT AND METHODS OF FABRICATING THEREOF

CROSS REFERENCE TO RELATED APPLICATIONS

This application is a divisional of U.S. patent application Ser. No. 14/463,583, filed on Aug. 19, 2014, which claims priority to U.S. patent application Ser. No. 12/842,903, filed on Jul. 23, 2010, which claims priority to Chinese Patent Application No. 200910055410.5, filed on Jul. 24, 2009, and Chinese Patent Application No. 200910055408.8, filed on Jul. 24, 2009, all of which are incorporated herein by reference in their entirety.

FIELD OF THE INVENTION

The present invention relates to the field of semiconductor technologies, and in particular to a bipolar transistor, a method for forming the bipolar transistor, a method for triggering the bipolar transistor, and a band-gap reference circuit, a virtual ground reference circuit and a double band-gap voltage circuit including the bipolar transistor.

BACKGROUND OF THE INVENTION

There are two basic types of bipolar transistors: PNP and NPN. One bipolar transistor consists of two back-to-back PN junctions. In such a three-layered semiconductor, the intermediate layer is referred to as a base area (b), and the left and right layers are referred to as an emitter area (e) and a collector area (c) respectively. An emitter junction is formed between the emitter area and the base area, and a collector junction is formed between the collector area and the base area.

Structures of the bipolar transistor and methods for manufacturing the bipolar transistor have been studied for a long time, and reference can be made to the disclosure of Chinese Patent Application No. 91104429.9 for common structures of the bipolar transistor and methods for manufacturing the bipolar transistor.

Also, there is disclosed in the prior art the structure of a vertical NPN-type bipolar transistor parasitic in the structure of conventional nMOS transistor as illustrated in FIG. 1. The NPN-type bipolar transistor includes a p-type semiconductor substrate 100, a deep n-type doped well 101 (DNW) arranged in the semiconductor substrate 100, a p-type doped well 102 (PW) arranged in the semiconductor substrate 100 and surrounded by the deep n-type doped well 101, and an n+ doped area in the semiconductor substrate 100 to form the source and the drain of the nMOS transistor. The deep n-type doped well 101, the p-type doped well 102 and the n+ doped area form an NPN bipolar transistor. Of course, the conventional nMOS transistor further includes a gate dielectric layer 103 and a polysilicon gate 104.

Similarly, a vertical parasitic PNP-type bipolar transistor can be formed in the structure of a pMOS transistor.

In the above NPN-type bipolar transistor, the deep n-type doped well 101 serves as a collector electrode, the p-type doped well 102 serves as the base, and the n+ doped area serves as the emitter electrode. Electrodes are formed respectively and connect to the emitter electrode, the base, and the collector via contacts and then a current source is applied to the base in order to operate the bipolar transistor for turn-on or off.

Moreover, a precise and stable voltage reference circuit is required in various integrated circuits, e.g. a Digital to Analogy Converter (DAC), an Analogy to Digital Converter (ADC), a linear manostat, a switch manostat, etc. The reference voltage can influence directly the performance of integrated circuits and thus requires good stability and precision. The band-gap reference circuit is one of the widely used circuits with low temperature coefficient.

The characteristic voltage inherent to the silicon material itself (i.e. the silicon band-gap) is widely used in a reference voltage circuits for high precision. However, the silicon material has a certain temperature coefficient, thus it is common to select another device parameter with a temperature coefficient of opposite polarity and approximately same magnitude (e.g., the $\Delta V_{BE}$ circuit), so that by adding the 2 parameters with opposite temperature coefficients together the overall net temperature coefficient can be nearly zero.

The band-gap reference circuit is an elementary circuit offering a stable reference voltage (~1.2V). Its stability (with respect to temperature) is related to an output voltage which is a combination of $V_{BE}$ (a base-emitter bias voltage) and $\Delta V_{BE}$ (the difference between two base-emitter bias voltages) with their temperature coefficients cancelling each other.

SUMMARY OF THE INVENTION

The invention provides a bipolar transistor, a method for forming the bipolar transistor, a method for triggering the bipolar transistor, and a band-gap reference circuit, a virtual ground reference circuit and a double band-gap voltage circuit with the bipolar transistor.

In order to address the foregoing issue, an embodiment of the invention provides a bipolar transistor, including: a Silicon-On-Insulator wafer comprising a silicon substrate and a buried oxide layer and a top silicon layer sequentially on the silicon substrate; a base area, an emitter area and a collector area in the top silicon layer, the base area being between the emitter area and the collector area, the conductivity type of the emitter area being the same as that of the collector area, and the conductivity type of the base area being opposite to those of the emitter area and the collector area; a base area gate dielectric layer on the top silicon layer atop the base area; a base area control-gate on the base area gate dielectric layer; an emitter electrode connected to the emitter area via a first contact; and a collector electrode connected to the collector area via a second contact, wherein the bipolar transistor further includes: a base area control-gate electrode connected to the base area control-gate via a third contact.

The bipolar transistor further includes a buffer area between the collector area and the base area, wherein the buffer area has the same doping type as that of the collector area but a lighter doping concentration than that of the collector area, and the interfaces between the buffer area and the collector area and between the emitter area and the base area are angled with respect to the surface of the semiconductor substrate.

The base area control-gate is of polysilicon and has the opposite conductivity type to that of the base area.

The bipolar transistor further includes an isolation layer on the top silicon layer on both sides of the base area gate dielectric layer and the base area control-gate.

A method for fabricating a bipolar transistor includes: preparing a Silicon-On-Insulator wafer comprising a silicon substrate and a buried oxide layer and a top silicon layer sequentially on the silicon substrate; forming an active area in the top silicon layer; performing a first implantation in the active area; patterning a base area in the active area and forming sequentially a base area gate dielectric layer and a base area control-gate on the top silicon layer and atop the base area; performing a second implantation in the active area except the base area using ions of the opposite conductivity type to that of the first implantation to form an emitter area and a collector area; forming a first interlayer dielectric layer on the top silicon layer to cover the base area gate dielectric layer and the base area control-gate; forming a first contact, a second contact and a third contact in the first interlayer dielectric layer; and forming a conductive layer on the first interlayer dielectric layer to form an emitter electrode connected to the emitter area via the first contact, a collector electrode connected to the collector area via the second contact, and a base area control-gate electrode connected to the base area control-gate via the third contact.

The method for fabricating a bipolar transistor further includes performing additional implantations in the base area using ions of the same conductivity type as that of the first implantation.

The method for fabricating a bipolar transistor further includes performing a third implantation in the active area except the base area using ions of the same conductivity type as that of the second implantation in an angled direction with respect to the surface of the semiconductor substrate to form a buffer area connecting the base area and the collector area after performing the second implantation and before forming the first interlayer dielectric layer.

The base area control-gate is of polysilicon, and the method further comprises the step of doping the base area control-gate so that the conductivity type of the doped base area control-gate is opposite to that of the base area.

A method for turning on the bipolar transistor includes: applying a first voltage to the base area control-gate electrode; applying a second voltage to the collector electrode; and applying a third voltage to the emitter electrode, wherein minority carriers are formed on the surface of the collector area due to the electric field resulting from the base area control-gate voltage, the minority carriers are of the same type as majority carriers in the base area and flow into the base area to form a gate-induced drain leakage current, and the gate-induced drain leakage current continuously flow into the emitter area to forward bias the PN junction between the base area and the emitter area.

The conductivity type of the base area is the p-type, the conductivity types of the collector area and the emitter area are the n-type, and the first voltage applied to the base area control-gate electrode is below the second voltage applied to the collector electrode, and the third voltage applied to the emitter electrode is below the first voltage.

The base area is the n-type, the collector area and the emitter area are the p-type, and the first voltage applied to the base area control-gate electrode is above the second voltage applied to the collector electrode, and the third voltage applied to the emitter electrode is above the second voltage.

A band-gap reference source circuit with the bipolar transistor includes: a first terminal and a second terminal with a first voltage difference; a first current source with one terminal electrically connected to the first terminal; a first bipolar transistor with an emitter electrode connected to the other terminal of the first current source; a first load with one terminal electrically connected to a collector electrode of the first bipolar transistor and the other terminal electrically connected to the second terminal; a third terminal and a fourth terminal with a second voltage difference; a second current source with one terminal electrically connected to the third terminal; a second bipolar transistor with an emitter electrode connected to the other terminal of the second current source; a second load with one terminal electrically connected to a collector electrode of the second bipolar transistor and the other terminal electrically connected to the fourth terminal; wherein a base area control-gate electrode of the first bipolar transistor and a base area control-gate electrode of the second bipolar transistor are connected to output of the band-gap reference source circuit; and a control unit with a first input electrically connected to the emitter electrode of the first bipolar transistor, a second input electrically connected to the emitter electrode of the second bipolar transistor, and an output electrically connected to the output of the band-gap reference source circuit, wherein the control unit is adapted to adjust dynamically an output voltage to make both currents at the emitter electrode and the collector electrode of the first bipolar transistor to be the same as the current output from the first current source, to make both currents at the emitter electrode and the collector electrode of the second bipolar transistor to be the same as the current output from the second current source, and to make a temperature coefficient of the output voltage of the band-gap reference source circuit nearly zero by selecting magnitudes of the first voltage difference, the second voltage difference, the output current of the first current source, the output current of the second current source, the first load and the second load.

The first bipolar transistor is in the same structure and size as those of the second bipolar transistor, the first voltage difference is the same as the second voltage difference, the first load is a first resistor and a second resistor, and the second load is the second resistor.

Both the first bipolar transistor and the second bipolar transistor are of the NPN type, the first terminal and the third terminal are grounded, and the second terminal and the fourth terminal are connected to an external voltage source.

Both the first bipolar transistor and the second bipolar transistor are of the PNP type, the first terminal and the third terminal are connected to an external voltage source, and the second terminal and the fourth terminal are grounded.

A bipolar transistor includes: a Silicon-On-Insulator wafer comprising a silicon substrate and a buried oxide layer and a top silicon layer sequentially on the silicon substrate; a base area, an emitter area and a collector area in the top silicon layer, the base area being between the emitter area and the collector area, the conductivity type of the emitter area being the same as that of the collector area, and the conductivity type of the base area being opposite to those of the emitter area and the collector area; a base area gate dielectric layer on the top silicon layer and atop the base area; a polysilicon layer on the base area gate dielectric layer; an emitter electrode connected to the emitter area via a first contact; and a collector electrode connected to the collector area via a second contact, wherein the bipolar transistor further includes: a base area control-gate electrode connected to the polysilicon layer via a third contact, the conductivity type of the polysilicon layer being the same as that of the base area and opposite to those of the emitter area and the collector area.

The bipolar transistor further includes a buffer area between the collector area and the base area, wherein the buffer area has the same doping type as that of the collector area but a lighter doping concentration than that of the collector area, and the interfaces between the buffer area and the collector area and between the emitter area and the base area are angled with respect to the surface of the semiconductor substrate.

The doping concentrations of the polysilicon layers of a first bipolar transistor and a second bipolar transistor range from $10^{19}$ cm$^{-3}$ to $10^{22}$ cm$^{-3}$.

A method for fabricating a bipolar transistor includes: preparing a Silicon-On-Insulator wafer comprising a silicon substrate and a buried oxide layer and a top silicon layer sequentially on the silicon substrate; forming an active area in the top silicon layer; performing a first implantation in the active area; patterning a base area in the active area and forming sequentially a base area gate dielectric layer and a polysilicon layer on the top silicon layer and atop the base area; performing a fourth implantation in the polysilicon layer to make the conductivity type of the polysilicon layer the same as that of the base area; performing a second implantation in the active area except the base area using ions of the opposite conductivity type to that of the first implantation to form an emitter area and a collector area; forming a first interlayer dielectric layer on the top silicon layer to cover the base area gate dielectric layer and the polysilicon layer; forming a first contact, a second contact and a third contact in the first interlayer dielectric layer; and forming a conductive layer on the first interlayer dielectric layer to form an emitter electrode connected to the emitter area via the first contact, a collector electrode connected to the collector area via the second contact, and a base area control-gate electrode connected to the polysilicon layer via the third contact.

The method for fabricating a bipolar transistor further includes performing additional implantations in the base area using ions of the same conductivity type as that of the first implantation.

The method for fabricating a bipolar transistor further includes performing a third implantation in the active area except the base area using ions of the same conductivity type as that of the second implantation in an angled direction with respect to the surface of the semiconductor substrate to form a buffer area connecting the base area and the collector area after performing the second implantation and before forming the first interlayer dielectric layer.

A method for turning on the bipolar transistor includes: applying a first voltage to the base area control-gate electrode; applying a second voltage to the collector electrode; and applying a third voltage to the emitter electrode, wherein minority carriers are attracted on the surface of the collector area due to the electric field resulting from the base area control-gate voltage, the minority carriers are of the same type as majority carriers in the base area and flow into the base area to form a gate-induced drain leakage current, and the gate-induced drain leakage current continuously flow into the emitter area to forward bias the PN junction between the base area and the emitter area.

The conductivity type of the base area is the p-type, the conductivity types of the collector area and the emitter area are the n-type, and the first voltage applied to the base area control-gate electrode is below the second voltage applied to the collector electrode, and the third voltage applied to the emitter electrode is below the first voltage.

The conductivity type of the base area is the n-type, the conductivity types of the collector area and the emitter area are the p-type, and the first voltage applied to the base area control-gate electrode is above the second voltage applied to the collector electrode, and the third voltage applied to the emitter electrode is above the second voltage.

A virtual ground reference circuit with a bipolar transistor includes: a first terminal and a second terminal with a first voltage difference; a first current source with one terminal electrically connected to the first terminal; a first bipolar transistor with an emitter electrode connected to the other terminal of the first current source; a first load with one terminal electrically connected to a collector electrode of the first bipolar transistor and the other terminal electrically connected to the second terminal; a third terminal and a fourth terminal with a second voltage difference; a second current source with one terminal electrically connected to the third terminal; a second bipolar transistor with an emitter electrode connected to the other terminal of the second current source; a second load with one terminal electrically connected to a collector electrode of the second bipolar transistor and the other terminal electrically connected to the fourth terminal; wherein a base area control-gate electrode of the first bipolar transistor and a base area control-gate electrode of the second bipolar transistor are connected to an output of the virtual ground reference circuit, and both the first bipolar transistor and the second bipolar transistor are of the PNP type; and a control unit with a first input electrically connected to the emitter electrode of the first bipolar transistor, a second input electrically connected to the emitter electrode of the second bipolar transistor, and an output electrically connected to the output of the virtual ground reference circuit; wherein the control unit is adapted to make both currents at the emitter electrode and the collector electrode of the first bipolar transistor to be the same as the current output from the first current source, to make both currents at the emitter electrode and the collector electrode of the second bipolar transistor to be the same as the current output from the second current source, and to make a temperature coefficient of an output voltage of the virtual ground reference circuit nearly zero by selecting magnitudes of the current output of the first current source, the output current of the second current source, the first load and the second load.

The first bipolar transistor is in the same structure as that of the second bipolar transistor, the first voltage difference is the same as the second voltage difference, the first load is a first resistor and a second resistor, and the second load is the second resistor.

The first terminal and the third terminal are connected to an external voltage source, and the second terminal and the fourth terminal are grounded.

The doping concentrations of the polysilicon layers of the first bipolar transistor and the second bipolar transistor are the same.

A double band-gap voltage circuit with a bipolar transistor includes: a first terminal and a second terminal with a first voltage difference; a first current source with one terminal electrically connected to the first terminal; a first bipolar transistor with an emitter electrode connected to the other terminal of the first current source; a first load with one terminal electrically connected to a collector electrode of the first bipolar transistor and the other terminal electrically connected to the second terminal; a third terminal and a fourth terminal with a second voltage difference; a second current source with one terminal electrically connected to the third terminal; a second bipolar transistor with an emitter electrode connected to the other terminal of the second current source; a second load with one terminal electrically connected to a collector electrode of the second bipolar transistor and the other terminal electrically connected to the fourth terminal; wherein a base area control-gate electrode of the first bipolar transistor and a base area control-gate electrode of the second bipolar transistor are connected to an output of the double band-gap voltage circuit, and both the first bipolar transistor and the second bipolar transistor are of the NPN type; and a control unit with a first input electrically connected to the emitter electrode of the first bipolar transistor, a second input electrically connected to the emitter electrode of the second bipolar transistor, and an output electrically connected to the output of the double band-gap voltage circuit; wherein the control unit is adapted to make both currents at the emitter electrode and the collector electrode of the first bipolar transistor to be the same as the current output from the first current source, to make both currents at the emitter electrode and the collector electrode of the second bipolar transistor to be the same as the current output from the second current source, and to make a temperature coefficient of an output voltage of the double band-gap voltage circuit be zero and the output voltage of the double band-gap voltage circuit be twice a silicon band-gap by selecting magnitudes of the output current of the first current source, the output current of the second current source, the first load and the second load.

The first bipolar transistor is in the same structure as that of the second bipolar transistor, the first voltage difference is the same as the second voltage difference, the first load is a first resistor and a second resistor, and the second load is the second resistor.

The first terminal and the third terminal are grounded, and the second terminal and the fourth terminal are connected to an external voltage source.

The doping concentrations of polysilicon layers of the first bipolar transistor and the second bipolar transistor are the same.

The inventive technical solutions have the following advantages over the prior art: a current can be applied indirectly to the base area to turn on the bipolar transistor by the GIDL mechanism due to the formation of the control-gate atop the base area. The control-gate is formed at same step as that for the MOS transistor. There is no direct formation of contacts to the base area in order to generate base current to turn on the bipolar transistor as in the prior art. The "gated" bipolar transistor thus formed is in substantially the same structure as the MOS transistor, and the processes of forming the bipolar transistor are fully compatible with the standard CMOS processes.

According to the inventive technical solutions, the buffer area of the same doping type as that of the collector area but with a lighter doping concentration than that of the collector area is formed between the collector area and the base area, so that a breakdown voltage between the emitter area and the collector area can be controlled by controlling the angle and dosage of the third implantation, and the step of forming the buffer area can be omitted by performing the angled third implantation with respect to the surface of the semiconductor substrate for a cost reduction.

In the band-gap reference source circuit formed according to the inventive technical solution, the bipolar transistors are in substantially the same structure as a MOS transistor, the base current can be formed by applying a voltage to the base area control-gate without the directly applying current into the base area of a bipolar transistor in a band-gap reference source circuit formed of conventional bipolar transistors.

According to the invention, the base area control-gate is formed atop the base area at same process steps of gate for MOS transistor. The bipolar transistor thus formed is in the substantially same structure as the MOS transistor with fabrication processes fully compatible with standard CMOS. The polysilicon layer on the base area is doped to make the conductivity type thereof the same as that of the base area to thereby change a band-gap of the bipolar transistor.

According to the invention, the buffer area of the same doping type as that of the collector area with a lighter doping concentration than that of the collector area is formed between the collector area and the base area, so that a breakdown voltage between the emitter area and the collector area can be controlled by adjusting the angle and dosage of the third implantation.

In the virtual ground reference circuit formed according to the invention, the bipolar transistors are in substantially the same structure as MOS transistor, so base current can be formed by applying and controlling a voltage to the base area control electrode Since the conductivity type of the polysilicon layer is the same as that of the base area to thereby change one band-gap of magnitude from the output of a band-gap reference circuit, and thus result in nearly 0v output as a "virtual ground" reference circuit.

DETAILED DESCRIPTION OF THE INVENTION

The inventors noticed that current is applied directly to the base to turn on the bipolar transistor parasitic in CMOS, however, such bipolar transistor needs contact to the base area. For improved performance of a bipolar transistor, more complex process and structures (e.g., a polysilicon emitter, an n+ buried layer, an epitaxial silicon, a SiGe base, etc.) were added into the standard CMOS process as in the prior art. Unfortunately, these added process steps and thermal cycles result in deviation from standard CMOS processes and degradation in CMOS logic libraries and IP's. Therefore, these methods are at high cost and never be widely used.

The Silicon-On-Insulator (SOI) technology is considered as one of the most attractive technologies at 32 nm CMOS node and beyond, and its parasitic lateral bipolar transistor offers reasonable performance. To form high performance lateral bipolar transistors in CMOS, one needs to fabricate a contact to the base area and a lightly doped collector (for achieving high $BV_{CEO}$) as the minimum process complexity added. Such high performance lateral bipolar transistor can be NPN or PNP types with structures substantially the same as n-MOS and p-MOS transistors respectively (with gate removed and base contacts added).

In this invention, the Gate-Induced-Drain-Leakage (GIDL) current in nMOS and pMOS transistors on SOI wafer is proposed to be used as the base current to turn on the parasitic lateral npn or pnp bipolar transistor (referred to as "GIDL triggered lateral bipolar transistor"). In order to generate GIDL current, a gate stack atop the base area is formed at the same process steps as the MOS transistors. The bipolar transistor with the turn-on by GIDL in this invention is referred to as GIDL triggered or bipolar transistor. The inventors can enhance the GIDL current (by enhancing the second implantation dosage and applying large enough gate electrode voltage) and the performance of the bipolar transistor by suppressing the MOS action of channel inversion (e.g. forming high threshold voltage of the base area). According to the invention, there are four masking steps added in the standard CMOS process, i.e. the additional implantations into the base area of the nMOS and pMOS transistors and second implantation for forming an emitter area and a collector area.

The inventive GIDL triggered lateral bipolar transistor on SOI has advantages of a small emitter/collector junction capacitance, voltage controlled base current with no external base contact, and a small input capacitance, . . . etc. The invention further provides a band-gap reference circuit and a virtual ground reference circuit based on the CMOS GIDL triggered bipolar transistor on SOI wafers.

The foregoing objects and advantages of the invention will become more apparent from the following description of embodiments with reference to the drawings.

1. The First Embodiment

Figure 1:
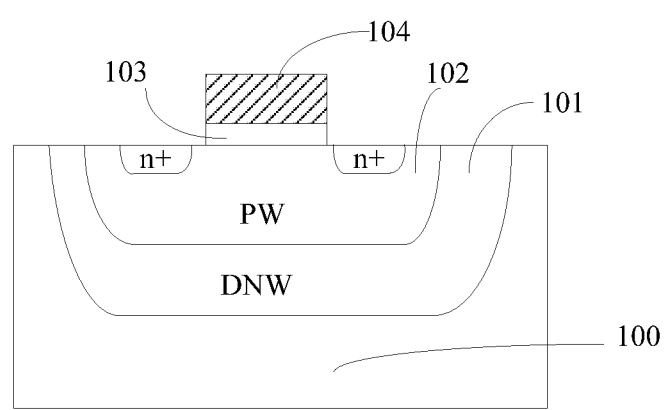
FIG. 1 is a schematic cross-section view of a conventional bipolar transistor.
Figure 2:
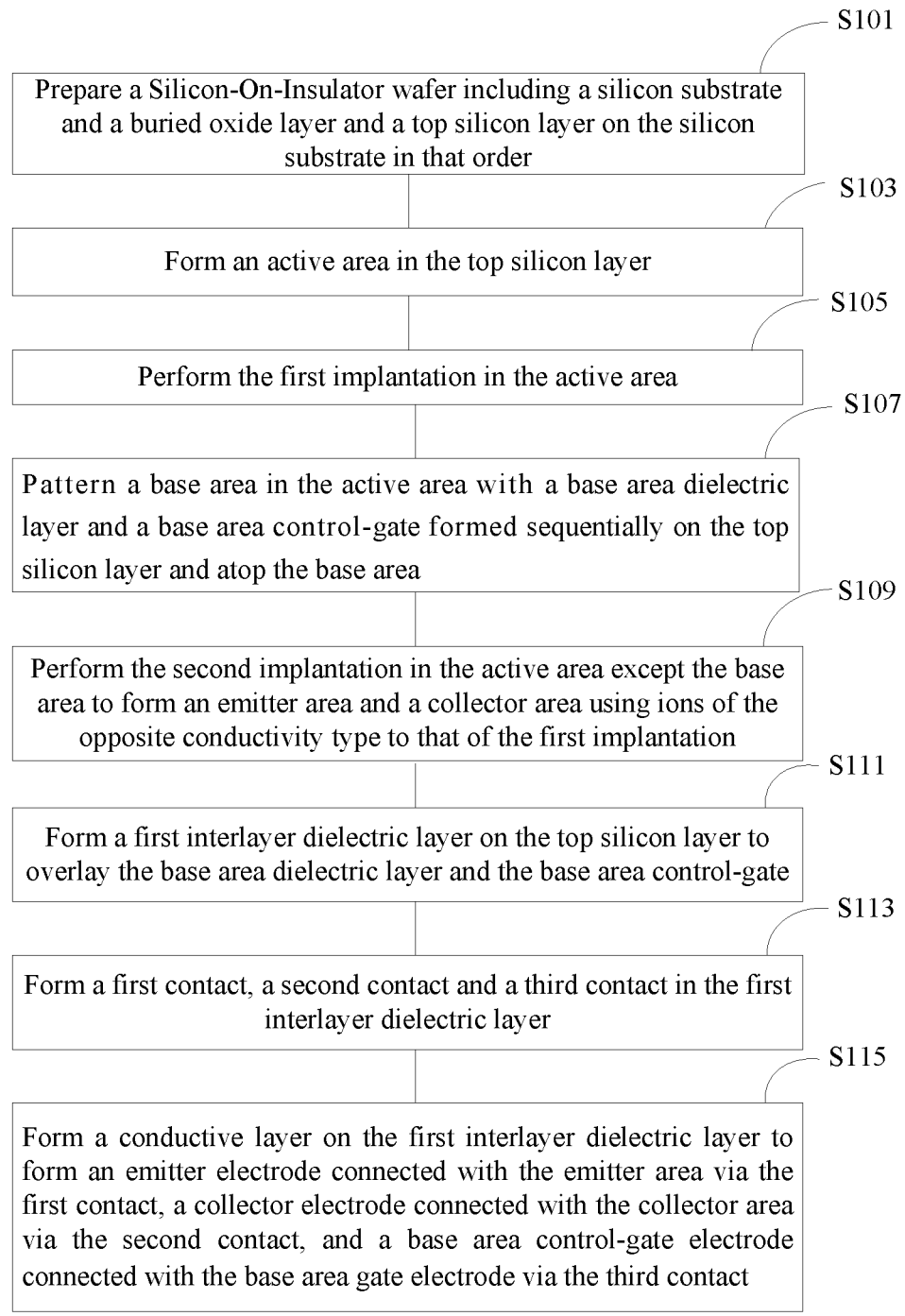
FIG. 2 is a schematic flow diagram of a method for forming a bipolar transistor according to a first embodiment of the invention.

An embodiment of the invention firstly provides a method for fabricating a bipolar transistor and also forming a MOS transistor, a specific flow is illustrated in FIG. 2 includes: step S101 where a SOI wafer is provided, which includes a silicon substrate, and a buried oxide layer and a top silicon layer arranged on the silicon substrate orderly; step S103 where an active area is formed in the top silicon layer; step S105 where a first implantation is performed in the active area; step S107 where a base area is patterned in the active area with a base area gate dielectric layer and a base area control-gate as formed sequentially on the top silicon layer and atop the base area; step S109 where a second implantation is performed in the active area except the base area (with the gate stack atop the base area as a mask to implantation) to form an emitter area and a collector area using ions of a conductivity type opposite to that for the first implantation; step S111 where a first interlayer dielectric layer is formed on the top silicon layer to overlay the base area gate dielectric layer and the base area control-gate; step S113 where a first contact, a second contact and a third contact are formed in the first interlayer dielectric layer; and step S115 where a conductive layer is formed on the first interlayer dielectric layer to form an emitter electrode connected to the emitter area via the first contact, a collector electrode connected to the collector area via the second contact, and a base area control-gate electrode connected to the base area control-gate via the third contact. Note that the base area is not directly connected to the third contact or the base area control-gate electrode.

The foregoing method for forming a bipolar transistor and also a MOS transistor will be set forth in detail below with reference to the drawings.

Figure 3:
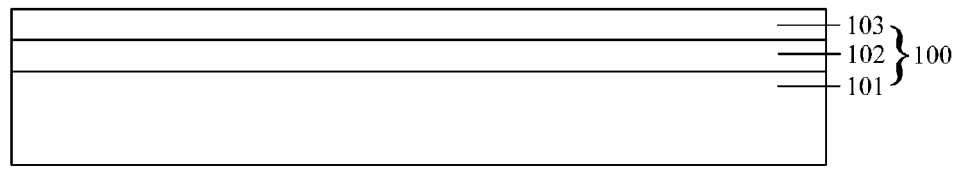
FIG. 3 to FIG. 13 are schematic cross-section view of the method for forming a bipolar transistor according to the first embodiment of the invention.

Firstly referring to FIG. 3, step S101 is performed where a Silicon-On-Insulator (SOI) wafer 100 is provided and includes: a silicon substrate 101, a buried oxide layer 102 on the silicon substrate 101, and a top silicon layer 103 on the buried oxide (BOX) layer 102.

The conductivity type of the top silicon layer 103 of the SOI wafer 100 can be made p-type or n-type in the subsequent CMOS process for forming the NPN or PNP lateral bipolar transistor (and also nMOS and pMOS) respectively. Methods for forming NPN and PNP bipolar transistors will be described, but it shall be noted that in the present embodiment of the invention the scope of the invention will not be limited in this respect.

The thickness of the top silicon layer 103 of the SOI wafer 100 typically ranges from 10 nm to 150 nm.

The insulating buried oxide layer 102 is sandwiched between the two layers of silicon substrates in the SOI wafer 100. The BOX layer 102 is typically of silicon oxide with a thickness typically from 100 nm to 1 μm. Semiconductor devices formed on the SOI wafer 100 have the advantages of small junction capacitance, less short channel effect of MOS transistors, high speed, high level of integration, low power consumption, better heat resistance, radiation resistance, . . . etc.

Then step S103 is performed where an active area is formed in the top silicon layer 103. Particularly, a shallow trench is formed in the top silicon layer 103 to isolate transistors on the SOI wafer 100.

Figure 4:
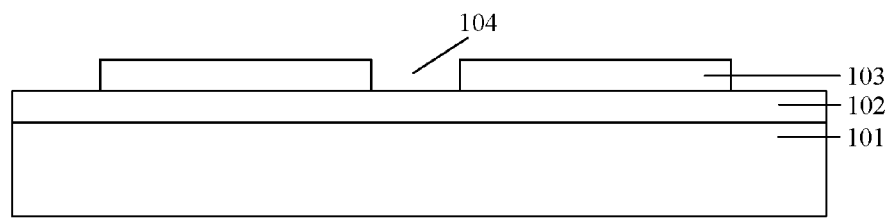

A process of forming the shallow trench is illustrated in FIG. 4 where the top silicon layer 103 on the SOI wafer 100 is etched selectively until the BOX layer 102 is exposed to form the shallow trench 104.

Figure 5:
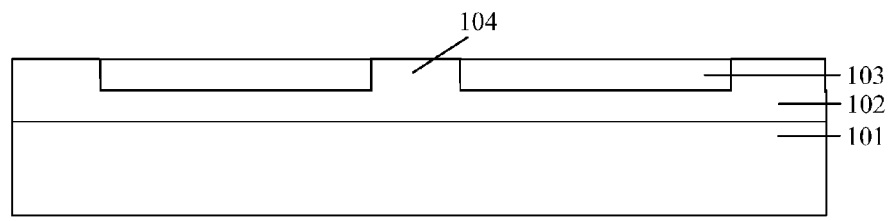

Next, as illustrated in FIG. 5, the shallow trench 104 is filled with a dielectric material and planarized by the chemical-mechanical-polish (CMP) method. The dielectric material filled in the shallow trench 104 may be the same as the material of the BOX layer 102

The chemical mechanical polishing (CMP) is well known to those skilled in the art, and is not repeated here.

The active area is thus formed through the foregoing process.

Next, step S105 is performed for the first implantation in the active area for preparing the base area of the bipolar transistor (and also of the MOS transistor).

Figure 6:
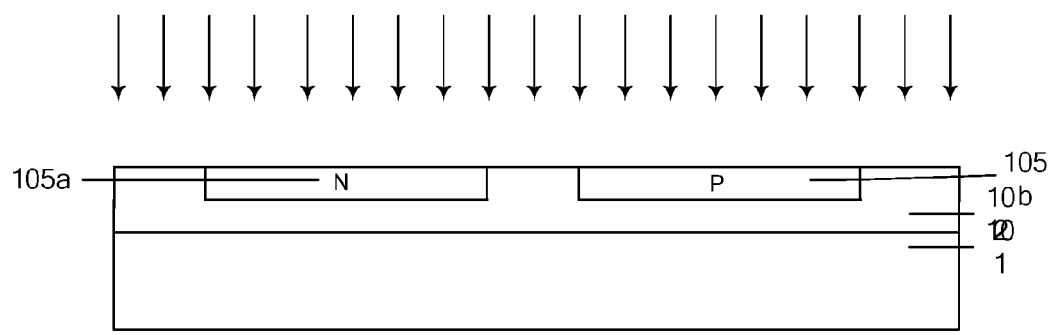

Referring to FIG. 6, the type of ions for the first implantation may be selected dependent upon the bipolar transistors to be fabricated (i.e. npn or pnp bipolar transistors). For example, p-type ions (e.g., boron ions) will be implanted with an energy ranging from 1 KeV to 60 Kev and a dosage ranging from $1 \times 10^{12}$ cm$^{-2}$ to $1 \times 10^{13}$ cm$^{-2}$ for fabricating an NPN-type transistor (or also for N-type MOS transistor). In another example, n-type ions (e.g., phosphor or arsenic ions) will be implanted with an energy ranging from 5 KeV to 300 Kev and a dosage ranging from $1 \times 10^{12}$ cm$^{-2}$ to $1 \times 10^{13}$ cm$^{-2}$ for fabricating PNP-type transistor (or also the p-type MOS transistors). The resulted concentration of ions in the active area ranges from $1\times10^{17}$ cm$^{-3}$ to $1\times10^{20}$ cm$^{-3}$.

As mentioned above, the implantation step is also a process of forming the doping concentration of the base for the MOS transistors.

As illustrated in FIG. 6, an n-type first implantation area 105a and a p-type first implantation area 105b are formed respectively by two masking steps and repeating the first implantation of n-type and p-type ions in sequential manner.

Moreover and just for bipolar transistors, additional implantations may further be performed on the first implantation area 105a and the first implantation area 105b to further increase the doping concentration in the base area respectively (for suppressing the inversion of the base area). The conductivity type of ions for the additional implantations is the same as that of ions for the first implantation (i.e., the base area of the bipolar transistor to be formed). After the additional implantations performed, the doping concentration in the base area of the bipolar transistor (to be formed) ranges from approximately 2 to 10 times that in a channel area of MOS transistor, and therefore the surface of the base area will not be inverted by a voltage applied to a base area control-gate. Notice that the additional implantations are only for bipolar transistors.

In an embodiment, boron ions are with energy of 10 Kev and a dosage of $3\times10^{12}$ cm$^{-2}$ for an NPN-type bipolar transistor.

In another embodiment, phosphor ions are with energy of 30 Kev and a dosage of $2\times10^{12}$ cm$^{-2}$ for a PNP-type bipolar transistor.

Two masks (respectively for NPN-type and PNP-type bipolar transistors) will be required for the additional implantations.

Figure 7:
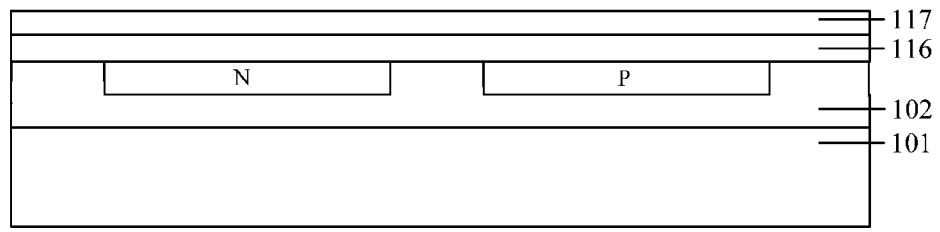
Figure 8:
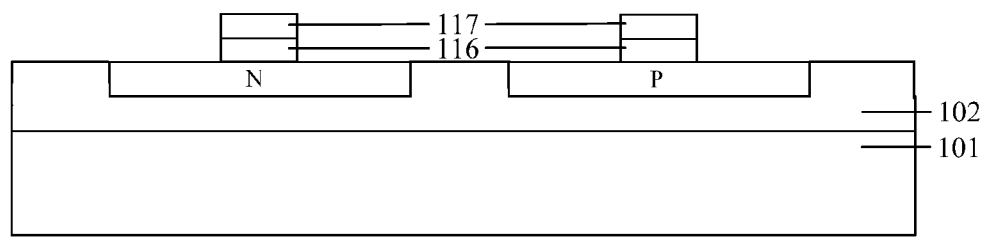

Then step S107 is performed where a base area is patterned in the active area, a base area gate dielectric layer and a base area control-gate (for the bipolar transistors and also the MOS transistor) are formed sequentially on the top silicon layer and atop the base area. Reference is made particularly to FIG. 7 and FIG. 8.

Firstly referring to FIG. 7, a base area gate dielectric layer 116 and a base area control-gate 117 are formed sequentially on the SOI wafer 100. The base area gate dielectric layer 116 may be of silicon oxide, silicon nitride, silicon oxynitride or a material with a high dielectric constant, e.g., hafnium oxide, aluminum oxide, etc. The base area control-gate 117 may be of polysilicon or metal or metal nitride, e.g., any one or combination of tungsten, tungsten nitride, aluminum, silver, chromium, molybdenum, nickel, palladium, platinum, titanium, titanium nitride, tantalum, tantalum nitride, . . . etc.

Next referring to FIG. 8, the gate stack atop the base area is patterned (by masking and etching the materials of base area gate dielectric layer 116 and the base area control-gate 117).

A specific process may be as follows: a photoresist layer is formed on the base area control-gate 117; the photoresist layer is exposed using a mask with patterns of the base area (and also of the gate of MOS transistors) and developed and then plasma etching is performed to remove the exposed base area control-gate 117 and the base area gate dielectric layer 116 sequentially with the photoresist mask.

The above process of patterning the gate-stack atop the base area can be performed at same steps of gate stack formation for the CMOS transistors.

Figure 9:
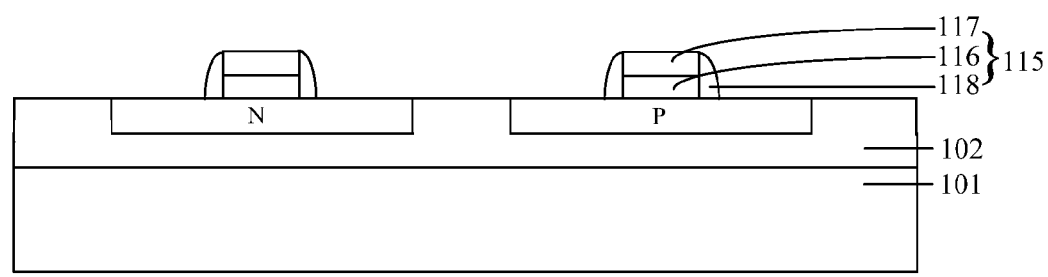

In the present embodiment, an isolation layer 118 can further be formed on the sidewalls of the etched base area gate dielectric layer 116 and base area control-gate 117 as illustrated in FIG. 9. The isolation layer 118 may be of any one or combination of silicon oxide, silicon nitride and silicon oxynitride.

Figure 10:
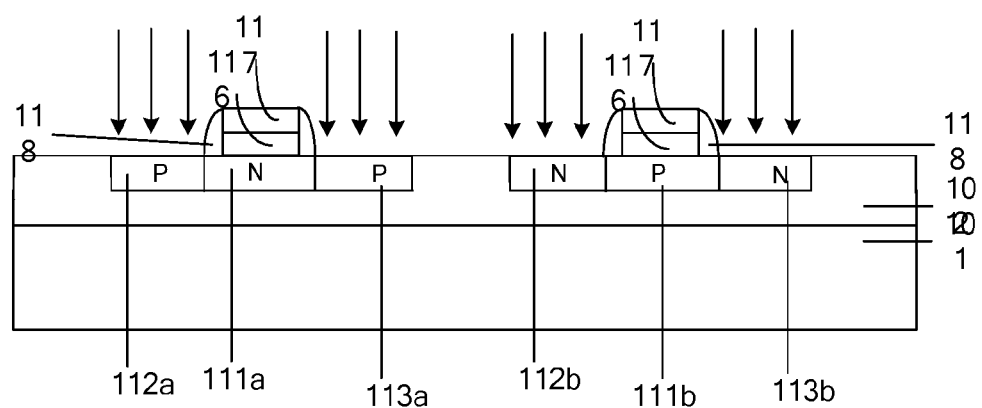

Then referring to FIG. 10, step S109 is performed for the second implantation on the active area to form respectively a p-type emitter area 112a and a p-type collector area 113a, and an n-type emitter area 112b and an n-type collector area 113b. Moreover, the second implantation will not penetrate into the first implantation areas 105a and 105b due to the gate stack atop the base areas as the mask to implantation.

The conductivity type of ions for the second implantation is opposite to that of the ions for the first implantation. For example, n-type ions will be implanted in this step if p-type ions are implanted in the first implantation, and p-type ions will be implanted in this step if n-type ions are implanted in the first implantation. Moreover, the dosage of ions implanted is light (for forming the light doped collector) but sufficient enough to counteract the doping from the first implantation.

The second implantation may be performed with a dosage at $10^{14}$ orders of magnitude and an energy varying with the type of ions. If n-type ions are implanted in the second implantation, then implanted ions may be phosphor or arsenic ions with an energy ranging from 1 KeV to 100 KeV.

In another embodiment, if p-type ions are implanted in the second implantation, then implanted ions may be boron or boron fluoride ions with an energy ranging from 1 KeV to 100 KeV.

The second implantation (with light dose) for bipolar transistors is similar to the Lightly Doped Drain (LDD) implantation for CMOS transistors; therefore, they may be performed at same steps, but for optimizing performance of bipolar transistor (e.g. $BV_{CEO}$), the energy and dose of the second implantation for bipolar transistors shall be performed separately than the LDD implantation for CMOS transistors. Furthermore, even if skipping the second implantation, the lateral bipolar transistor still can function well except the breakdown voltage is not high. Note that the scope of the invention will not be limited in this respect.

Figure 11:
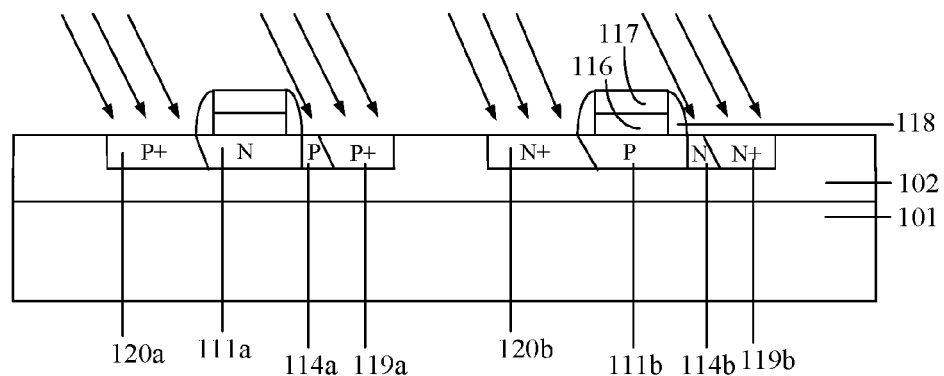

Referring to FIG. 11, the third implantation may be performed selectively in sequential manner (for npn and pnp bipolar transistors) to further dope part of the collector area and all of the emitter area to form the heavily doped emitter area and collector area. A part of the collector area which is not further doped forms the lightly doped buffer area. The conductivity type of ions for the third implantation is the same as that of ions for the second implantation.

In the present embodiment, the third implantation is performed in an angled direction with respect to the surface of the top silicon layer 103. Referring to FIG. 11, the emitter electrode is formed by the heavily-doped areas 120a and 120b and the collector electrode is formed by the heavily-doped collector areas 119a and 119b connected respectively with buffer areas 114a and 114b. It is the lighter doped area in collector contributes to higher breakdown voltage (e.g. $BV_{CEO}$) and also better collection efficiency of injected carriers from the emitter.

The third implantation is best performed at an angle ranging from 30° to 60° and preferably 40° to 50° and with a dosage of implanted ions at $10^{15}$ orders of magnitude.

With the angled third implantation according to the invention, there are equivalently two steps of implantation performed on the collector area and the emitter area. Those skilled in the art can properly adjust the parameters of the second implantation and the third implantation for maximizing the bipolar breakdown voltage, and the scope of the invention will not be limited in this respect.

Figure 12:
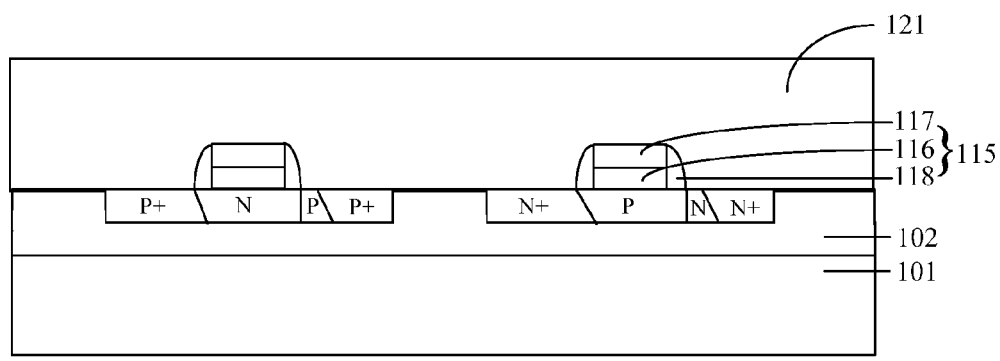

Step S111 is performed where a first interlayer dielectric layer 121 is formed on the top silicon layer to cover the base area gate dielectric layer 116 and the base area control-gate 117. Referring to FIG. 12, the first interlayer dielectric layer 121 may be of silicon oxide, silicon nitride, silicon oxynitride, doped silicate glass or a material with a low dielectric constant, e.g., doped silicon carbide, etc. The first interlayer dielectric layer 121 is formed for the purpose of isolating respective device layers.

Figure 13:
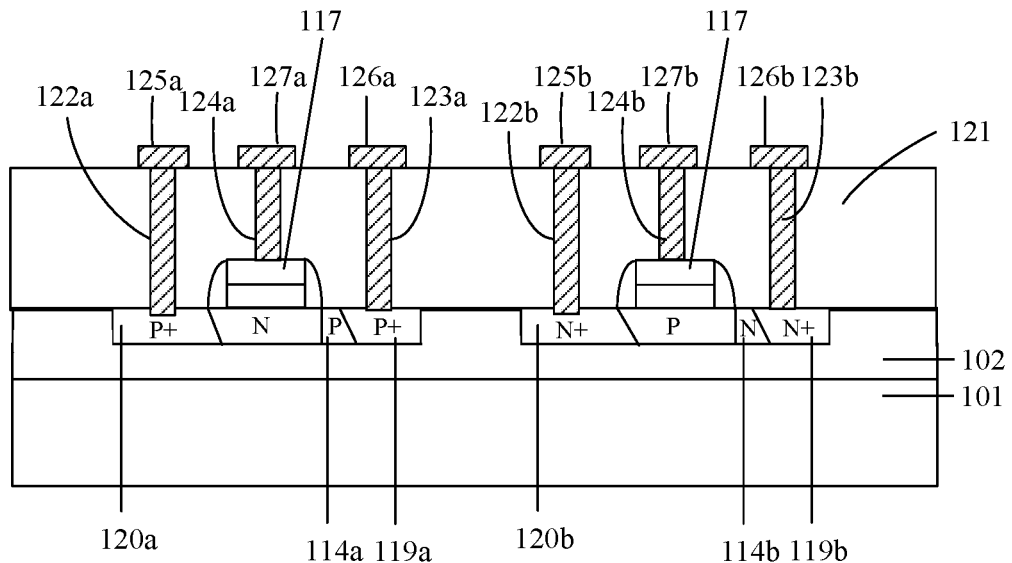

Step S113 and step S115 are performed. Referring to FIG. 13, the first contacts 122a and 122b, second contacts 123a and 123b, and third contacts 124a and 124b are formed respectively in the first interlayer dielectric layer 121. Next a conductive layer is deposited and patterned on the first interlayer dielectric layer 121 to form emitter electrodes 125a and 125b, collector electrodes 126a and 126b, and base area control-gate electrodes 127a and 127b. Wherein the emitter electrodes 125a and 125b are electrically connected to the emitters 120a and 120b respectively via the first contacts 122a and 122b, the collector electrodes 126a and 126b are connected to the collector areas 119a and 119b respectively via the second contacts 123a and 123b, and the base area control-gate electrodes 127a and 127b are connected to the base area control-gate 117 respectively via the third contacts 124a and 124b.

In the present embodiment, the base area control-gate electrodes 127a and 127b are simply metally connected to the base area control-gate 117 (atop the base area). The structure of the bipolar transistor thus formed has substantially the same structure as the MOS transistor (except those second and third implantations for the formation of base electrode, emitter electrode, and collector electrode) and the process of forming such bipolar transistor is fully compatible with a standard CMOS process. The base current to turn on the bipolar transistor is from the GIDL current by applying a voltage to the base area control-gate.

Moreover, the foregoing method for forming a bipolar transistor is fully compatible with standard CMOS processes, thus MOS transistors can be formed on the same wafer with the bipolar transistor. It shall be noted that only the process steps related to the bipolar transistor are described in more details as above.

The Second Embodiment

Now referring to FIG. 13, a bipolar transistor according to the first embodiment includes: a SOI wafer 100 including a silicon substrate 101 and a BOX layer 102 and a top silicon layer 103 (not shown in FIG. 13) sequentially on the silicon substrate 101; a base area 111a or 111b, an emitter area 120a or 120b and a collector area 119a or 119b in the top silicon layer 103, the base area 111a being between the emitter area 120a and the collector area 119a, the base area 111b being between the emitter area 120b and the collector area 119b, the conductivity type of the emitter area 120a or 120b being the same as that of the collector area 119a or 119b, and the conductivity type of the base area 111a or 111b being opposite to those of the emitter area 120a or 120b and the collector area 119a or 119b; a base area gate dielectric layer 116 on the top silicon layer 103 and atop the base area 111a or 111b; a base area control-gate 117 atop the base area gate dielectric layer 116; an emitter electrode 125a connected to the emitter area 120a via a first contact 122a, or an emitter electrode 125b connected to the emitter area 120b via a first contact 122b; and a collector electrode 126a to the collector area 119a via a second contact 123a, or a collector electrode 126b connected to the collector area 119b via a second contact 123b.

The bipolar transistor further includes a base area control-gate electrode 127a or 127b connected to the base area control-gate 117 via a third contact 124a or 124b.

A buffer area 114a is further included between the collector area 119a and the base area 111a, or a buffer area 114b is further included between the collector area 119b and the base area 111b, and the buffer 114a or 114b has the same doping type as that of the collector area 119a or 119b but has a lighter doping concentration than that of the collector area 119a or 119b.

The interfaces between the buffer area 114a and the collector area 119a, between the buffer area 114b and the collector area 119b, between the emitter area 120a and the base area 111a and between the emitter area 120b and the base area 111b are angled with respect to the surface of the top silicon layer 103 (due to the angled third implantation in FIG. 11).

The Third Embodiment

Figure 14:
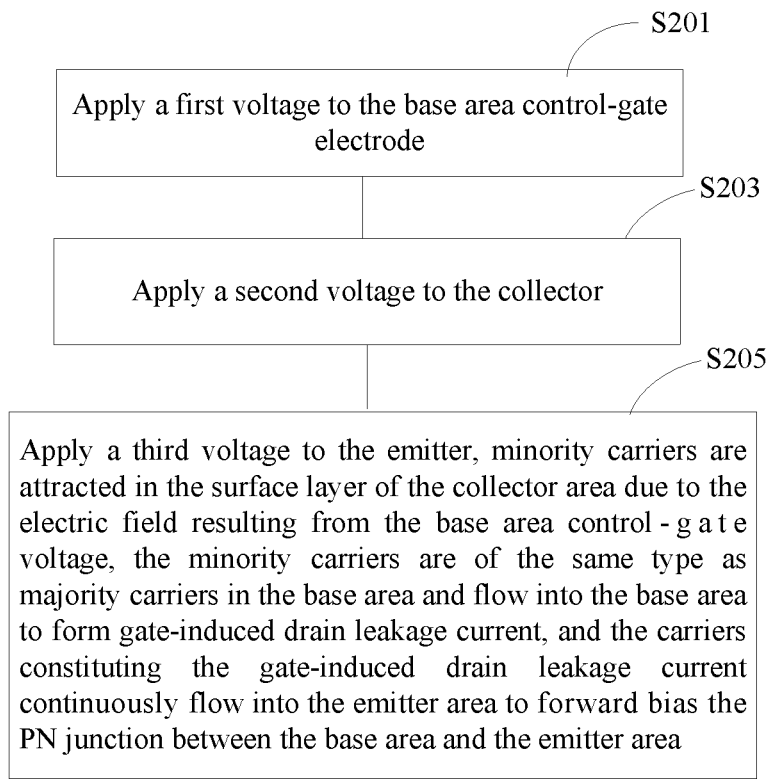
FIG. 14 is a schematic flow diagram of a method for triggering a bipolar transistor according to a third embodiment of the invention.

An embodiment of the invention further provides a method for turning on the bipolar transistor according to the second embodiment. FIG. 14 illustrates a schematic diagram of a specific flow of turning on the bipolar transistor, which includes: step S201 where a first voltage is applied to the base area control-gate electrode; step S203 where a second voltage is applied to the collector electrode; and step S205 where a third voltage is applied to the emitter electrode. Minority carriers are formed on the surface of the collector area due to the electric field resulting from the base area control-gate voltage. Specifically, minority carriers can be formed on the surface of the buffer area, and the minority carriers are of the same type as majority carriers in the base area and flow into the base area to form the GIDL current. The GIDL current continuously flow into the emitter area to forward bias the base-emitter junction, thus in turn, more carriers are injected from the emitter and turn-on the bipolar transistor.

Figure 15:
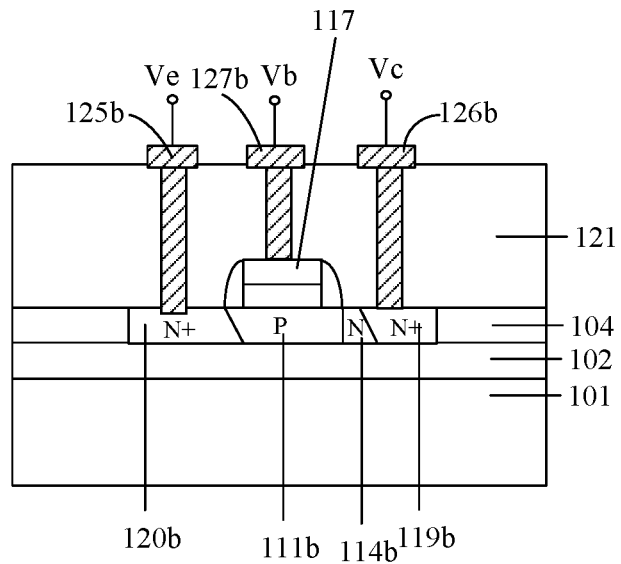
FIG. 15 is a schematic cross-section view of the method for triggering a bipolar transistor according to the third embodiment of the invention.

A method for turning on an NPN-type bipolar transistor and the principle thereof will be presented below with reference to FIG. 15. Respective reference numerals in FIG. 15 are the same layers as in FIG. 13.

A first voltage Vb is applied to the base area control-gate electrode 127b of the NPN type bipolar transistor; a second voltage Vc is applied to the collector 126b; and a third voltage Ve is applied to the emitter 125b, where Vb<Vc, and Ve<Vc.

Minority carriers (holes) in the present embodiment are formed on the surface of the (n-type) collector area 119b due to the electric fields resulting from the voltage Vb, and the minority carriers are of the same type as the majority carriers in the P-type base area 111b. Due to the lower first voltage Vb, the holes are attracted by the electric field resulting from the Vb and move toward and flow into the base area 111b to form GIDL current. Since Ve<Vc, the PN junction between the base area 111b and the emitter area 120b is forward biased with GIDL current as the base current, the (n-type) emitter 120b injects electrons into the base area and collected by the collector area 119b as the collector current with a magnitude of β times the GIDL current. Thus the turn-on of the NPN bipolar transistor is triggered.

In an embodiment, the first voltage Vb is below or equal to approximately 0.5Vdd, and the second voltage Vc is Vdd, the third voltage is 0V, and the silicon substrate of the SOI wafer is at 0V.

A similar method can be adopted to trigger a PNP-type bipolar transistor. For example, a first voltage Vb is applied to the base area control-gate electrode; a second voltage Vc is applied to the collector electrode; and a third voltage Ve is applied to the emitter electrode, where Vb>Vc, and Ve>Vc. In a practice application, when Ve>Vc, then the PN junction between the P-type emitter area and the N-type base area is already forward biased slightly, and the PN junction between the N-type base area and the P-type collector area is reverse biased. If momentarily the first voltage Vb is above both Vc and Ve, then the inverted electrons accumulated on the surface of the P-type collector area and emitter area, but only the inverted electrons on the surface of the collector area will flow into the N-type base area (to thereby more forward biasing the PN junction between the emitter area and the N-type base area and more holes injected. Typically, the first voltage Vb is between the third voltage Ve and the second voltage Vc.

In an embodiment, the first voltage Vb is above or equal to approximately 0.5Vdd, and the second voltage Vc is 0V, the third voltage Ve is Vdd, and the silicon substrate of the SOI wafer is at 0V.

The foregoing Vdd represents the voltage of an external voltage source, e.g., 3.3V, 2.5V, 1.8V, 1.0V, . . . etc. depending on the available voltage source from systems.

The Fourth Embodiment

Figure 16:
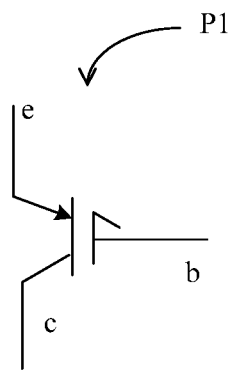
FIG. 16 and FIG. 17 are notations of a bipolar transistor according to an embodiment of the invention.
Figure 17:
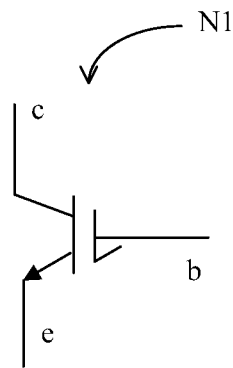

The inventors of the present application propose the following notations as illustrated in FIG. 16 and FIG. 17 for convenience and visualization.

FIG. 16 presents the notation of a PNP-type bipolar transistor P1, and FIG. 17 presents the notation of an NPN-type bipolar transistor N1. Each of the bipolar transistors P1 and N1 includes three electrodes, i.e., an emitter electrode e, a collector electrode c and a base area control-gate electrode b, respectively. For the PNP-type or npn-type bipolar transistor P1 and N1, the direction of the arrow of the base control-gate electrode indicates the polarity of the control-gate bias toward the emitter bias to trigger or turn on the bipolar transistor. The foregoing notations will be adopted in circuit diagrams to be described later.

An embodiment of the invention further provides a band-gap reference source circuit with the bipolar transistor. The essential idea of which is similar to the conventional band-gap circuits based on conventional bipolar transistors that a superposition of a negative temperature coefficient of an emitter junction voltage $V_{be}$ and a positive temperature coefficient of the difference between the emitter junction voltages $\Delta V_{be}$ to generate a reference voltage achieving nearly zero temperature coefficient. According to the invention, the voltage between the base area control-gate and the collector electrode (referred to as $V_{gd}$) has negative temperature coefficient (at constant GIDL current) and the difference of the base control-gate to collector voltage ($\Delta V_{gd}$) has positive temperature coefficient. More details are described below.

Figure 18:
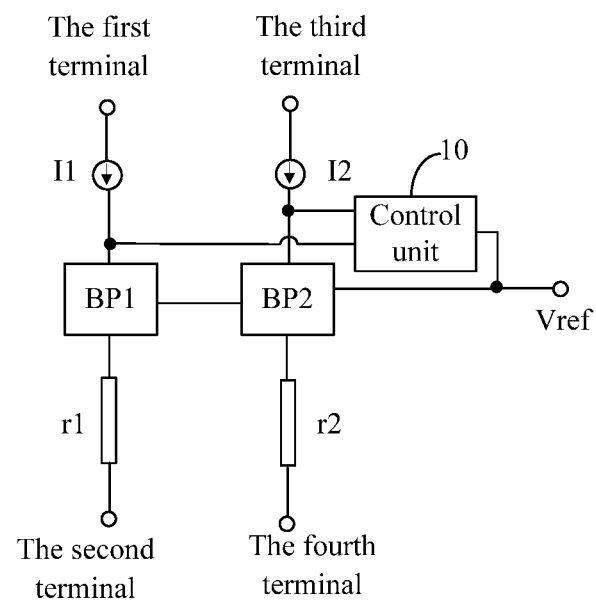
FIG. 18 illustrates a reference voltage circuit according to a fourth embodiment, a virtual ground reference circuit according to a tenth embodiment and a double band-gap voltage circuit according to an eleventh embodiment of the invention.

FIG. 18 illustrates a band-gap reference source circuit with the bipolar transistor according to the present embodiment, which includes: a first terminal and a second terminal with a first voltage difference; a first current source I1 with one terminal electrically connected to the first terminal; a first bipolar transistor BP1 with an emitter electrode electrically connected to the other terminal of the first current source, a collector electrode and a base area control-gate electrode; and a first load r1 with one terminal electrically connected to the collector electrode of the first bipolar transistor BP1 and the other terminal electrically connected to the second terminal.

The band-gap reference source circuit further includes: a third terminal and a fourth terminal with a second voltage difference; a second current source I2 with one terminal electrically connected to the third terminal; a second bipolar transistor BP2 with an emitter electrode electrically connected to the other terminal of the second current source I2, a collector electrode and a base area control-gate electrode; a second load r2 with one terminal electrically connected to the collector electrode of the second bipolar transistor BP2 and the other terminal electrically connected to the fourth terminal; and a base area control-gate electrode of the first bipolar transistor BP1 and a base area control-gate electrode of the second bipolar transistor BP2 being electrically connected to the output of the band-gap reference source circuit.

The band-gap reference source circuit further includes: a control unit 10 with a first input electrically connected to the emitter electrode of the first bipolar transistor BP1, a second input electrically connected to the emitter electrode of the second bipolar transistor BP2, and an output electrically connected to the output of the band-gap reference source circuit. The control unit can make both currents at the emitter electrode and the collector electrode of the first bipolar transistor BP1 to be the same as the current output from the first current source I1, and similarly, it can make both currents at the emitter electrode and the collector electrode of the second bipolar transistor BP2 to be the same as the current output from the second current source I2. The control unit can result in nearly zero temperature coefficient of the output voltage of the band-gap reference source circuit by selecting magnitudes of the first voltage difference, the second voltage difference, the output current of the first current source, the output current of the second current source, the first load and the second load.

From the circuit in FIG. 18, the reference voltage output therefrom $V_{ref}$ is:

$$V_{ref} = V_{gd2} + V_{r2} = V_{gd2} + I_{r2} \cdot r2;$$

Where $V_{gd2}$ is a voltage between the base area control-gate and the collector area of the second bipolar transistor BP2, $V_{r2}$ is a voltage across the second load r2, and $I_{r2}$ is a current across the second load r2. We assume the second terminal and fourth terminal are biased at the same level (e.g. 0v), and the first and the third terminal are biased at higher voltages (with no need to be the same level).

The control unit 10 can bias the base area control-gate of the first bipolar transistor BP1 and the second bipolar transistor BP2 equal, so:

$$I_{r2} = I_2 = (-V_{gd2} + V_{gd1} + I_1 r_1)/r_2 = \Delta V_{gd}/r_2 + I_1 r_1/r_2$$

Since the output current of the second current source and the output current of the first current source are typically designed in a specific relationship, here assumed as $I_2 = n\, I_1$;

Then $V_{ref} = V_{gd2} + \Delta V_{gd} \cdot n \cdot r_2/(n\, r_2 - r_1)$;

Therefore, the temperature coefficient of $V_{ref}$ can be represented by a combination of the temperature coefficients of $V_{gd}$ and ($\Delta V_{gd}$) as in below:

$$\delta(V_{ref}/\delta T) = \delta(V_{gd2})/\delta T + n \cdot r_2/(n r_2 + r_1) \cdot \delta(\Delta V_{gd})/\delta T$$

Experiment data shows $\delta(V_{gd2})/\delta T < 0$ and $\delta(\Delta V_{gd})/\delta T > 0$;

Therefore, the parameter $n \cdot r_2/(n\, r_2 + r_1)$ can be adjusted so that $\delta(V_{ref}/\delta_T)$ can be nearly zero for a stable output voltage $V_{ref}$. That is, the temperature coefficient of the output voltage of the band-gap reference source circuit can be made nearly zero by selecting the magnitudes of the first voltage difference, the second voltage difference, the output current of the first current source $I_1$, the output current of the second current source $I_2$, the first load $r_1$, the second load $r_2$ and an experiment temperature coefficient of $V_{gd}$ and $\Delta V_{gd}$.

In the present embodiment, the first bipolar transistor BP1 and the second bipolar transistor BP2 are identical in terms of their sizes and structures.

Further optimization can be performed to further reduce the complexity of adjustment, for example, by selecting the first voltage difference and the second voltage difference to be equal, by selecting a first resistor and a second resistor as the first load and the second resistor as the second load, . . . etc.

The principle on which the band-gap reference source circuit operates will be explained below by utilizing NPN-type and PNP-type bipolar transistors respectively as examples.

The Fifth Embodiment

Figure 19:
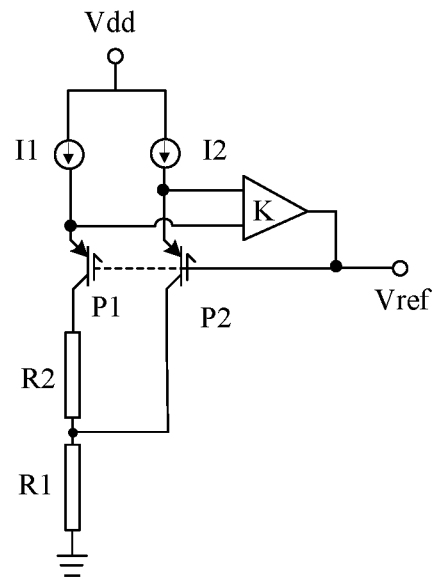
FIG. 19 illustrates a reference voltage circuit according to a fifth embodiment and the virtual ground reference circuit according to the tenth embodiment of the invention.

An embodiment of the invention further provides a band-gap reference source circuit with a PNP-type bipolar transistor according to the invention with reference to FIG. 19, which includes: a first current source I1 with an input electrically connected to a first external voltage source; a second current source I2 with an input electrically connected to a second external voltage source; a first resistor R1 and a second resistor R2 connected in series with one terminal grounded; and an operational amplifier K with two inputs connected respectively with outputs of the first current source I1 and the second current source I2. The band-gap reference source circuit further includes: a first bipolar transistor P1 with an emitter electrically connected to the output of the first current source I1 and a collector electrically connected to the other terminal of the serially connected first resistor R1 and the second resistor R2; a second bipolar transistor P2 with an emitter electrically connected to the output of the second current source I2 and a collector electrically connected between the first resistor R1 and the second resistor R2 connected in series; and a base area control-gate of the first bipolar transistor P1 and a base area control-gate of the second bipolar transistor P2 being connected to the output of the amplifier K, which is the output of a virtual ground circuit and outputs a reference voltage Vref, and the conductivity types of a polysilicon layer of the first bipolar transistor P1 and of the second bipolar transistor P2 being opposite to that of base area.

The second external voltage source is biased at the same voltage Vdd as that of the first external voltage source.

The foregoing control unit is the operational amplifier K as well-known to those skilled in the art, which will be described briefly below. The operational amplifier K can adjust dynamically its output voltage so that the 2 inputs (+) and (−) maintaining equal voltage. The output voltage will increase toward high even if the input (+) bias is slightly higher than that of the input (−); and similarly, the output voltage will decrease toward low even if the input (−) voltage is slightly below that of the input (+). Therefore, with dynamic adjusting the output voltage of the amplifier K, it is possible to result in both currents at the emitter electrode and the collector electrode of the first bipolar transistor BP1 to be the same as the current output from the first current source I1, and similarly, both currents at the emitter and the collector of the second bipolar transistor BP2 to be the same as the current output from the second current source I2. This results in the final output a silicon band-gap voltage circuit with a temperature coefficient nearly zero.

The output reference voltage $V_{ref}$ in FIG. 19 is with assumption of $I2=n \cdot I1$:

$$V_{ref}=V_{gd2}+V_{R1}=V_{gd2}+I_{R1} \cdot R1 = V_{gd2}+(n+1) \cdot I_1 \cdot R_1;$$

Where $V_{gd2}$ is a voltage difference between the base control-gate electrode and the collector electrode or (the gate electrode and the drain electrode) of the bipolar transistor P2, $V_{R1}$ is a voltage across the first resistor R1, and $I_{R1}=(n+1) \cdot I_1$;

$$I_{R2}=I_1=(V_{gd2}-V_{gd1})/R_2=\Delta V_{gd}/R_2;$$

$$V_{ref}=V_{gd2}+(n+1) \cdot \Delta V_{gd}(R_1/R_2); \quad (1)$$

In order to satisfy $\delta V_{ref}/\delta T \sim 0$, $$\delta(V_{ref}/\delta T)=\delta(V_{gd2})/\delta T+(n+1) \cdot (R_1/R_2) \cdot \delta(\Delta V_{gd})/\delta T$$

Since $\delta(V_{gd2})/\delta T<0$ and $\delta(\Delta V_{gd})/\delta T>0$,

Therefore, $\delta(V_{ref}/\delta_T)$ can be made nearly zero by adjusting $(n+1) \cdot (R_1/R_2)$ to derive the output voltage Vref with a temperature coefficient nearly zero.

Just for interest in device physics, for the PNP-type bipolar transistor, the foregoing $\delta(V_{gd2})/\delta T<0$ can be derived from the following reasoning:

$$I_{GIDL}=A \cdot E_s \cdot \exp(-B/E_s);$$

Where A is a constant proportional to the area of the collector area, $E_s$ is a surface electric field of the collector area, B is a constant, and $I_{GIDL}$ is the GIDL current of the first bipolar transistor P1;

$$E_s=(V_{dg}-E_g)/3T_{ox};$$

Where $E_g$ is the magnitude of a silicon band-gap voltage (approximately 1.2V), $V_{dg}$ is the difference between voltages of the collector area and the base area control-gate electrode, and $T_{ox}$ is a thickness of the base area gate dielectric layer of silicon oxide;

$$E_g=1.12-2.4 \cdot 10^{-4} \cdot (T-300)$$

The foregoing equation has been derived from experiments, where T denotes temperature;

$$\delta(I_{GIDL})/\delta T=I_{GIDL}(\delta E_s/\delta T) \cdot (1/E_s) \cdot (1+B/E_s), \text{which is approximately } +0;$$

$$\delta E_s/\delta T \sim 0 = (\delta V_{gd}/\delta T+2.4 \cdot 10^{-4})/3T_{ox};$$

Therefore $\delta V_{gd}/\delta T = -2.4 \cdot 10^{-4} < 0$;

The foregoing $\delta(\Delta V_{gd})/\delta T > 0$ can also be derived from the below analysis:

$$\Delta I_{GIDL} = I_{GIDL1} - I_{GIDL2} = I_{GIDL} \cdot (\Delta E_s/E_s)(1+B/E_s);$$

Where $I_{GIDL2}$ is the GIDL current of the second bipolar transistor P2

$$\Delta E_s = \Delta V_{gd}/3T_{ox}; \Delta V_{gd} = 3T_{ox} \cdot \Delta E_s;$$

$$\delta(I_{GIDL})/\delta T = I_{GIDL}(\delta \Delta E_s/\delta T)(1/E_s) \cdot (1+B/E_s) + I_{GIDL}(\Delta E_s/E_s^2)(-\delta E_s/\delta T)(1+B/E_s) + I_{GIDL}(\Delta E_s/E_s) \cdot (-B/E_s^2) \cdot (\delta E_s/\delta T) = 0;$$

Therefore $$\delta(\Delta V_{gd})/\delta T = 3T_{ox} \cdot (\delta \Delta E_s/\delta T) + \Delta E_s \cdot 3(\delta T_{ox}/\delta T)$$

$$= 3T_{ox} \cdot (E_s/(1+B/E_s)) \cdot$$

$$((\Delta E_s/E_s^2)(\delta E_s/\delta T)(1+B/E_s) + (\Delta E_s/E_s) \cdot B/E_s^2) \cdot$$

-continued $$(\delta E_s/\delta T) + \Delta E_s \cdot 3(\delta T_{ox}/\delta T)$$
$$= 3T_{ox} \cdot (\Delta E_s/E_s) \cdot (\delta E_s/\delta T) \cdot$$
$$(1 + (B/E_s)/(1 + B/E_s) + 3 \cdot \Delta E_s \cdot (\delta T_{ox}/\delta T)$$

Since $\delta E_s/\delta T \sim 0$ and $(\delta T_{ox}/\delta T) > 0$, then $\delta(\Delta V_{gd})/\delta T > 0$.

Here $V_{ref} = E_s \cdot 3T_{ox}$ and $V_{gd} \sim Eg$, where $V_{gd}$ results in band bending at surface for large enough $E_s$ to attract minority carriers and subsequently form GIDL current.

From the equation (1), $V_{ref}$ is the sum of two terms with $V_{gd}$ and $\Delta V_{gd}$, with opposite temperature coefficients; thus by adjusting the current source ratio (i.e. n) and resistors (R1 and R2) the temperature coefficient of $V_{ref}$ can be nearly zero. The magnitude of the overall final output voltage $V_{ref}$ is approximate to Eg.

The Sixth Embodiment

Figure 20:
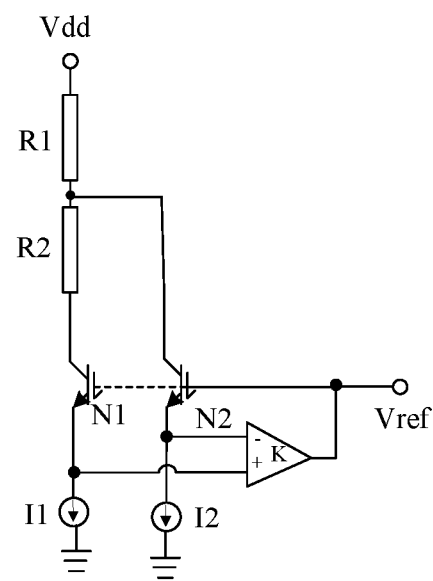
FIG. 20 illustrates a reference voltage circuit according to a sixth embodiment and the double band-gap voltage circuit according to the eleventh embodiment of the invention.

An embodiment of the invention further provides a band-gap reference source circuit with an NPN-type bipolar transistor according to the invention with particular reference to FIG. 20, which includes: a first resistor R1 and a second resistor R2 connected in series with one terminal electrically connected to an external voltage source; a first current source I1 with one terminal grounded; a second current source I2 with one terminal grounded; and an amplifier K with two inputs connected respectively to the other terminals of the first current source I1 and the second current source I2. The band-gap reference source circuit further includes: a first bipolar transistor N1 with an emitter electrically connected to the other terminal of the first current source I1 and a collector electrically connected to the other terminal of the first resistor R1 and the second resistor R2 connected in series; a second bipolar transistor N2 with an emitter electrically connected to the other terminal of the second current source I2 and a collector electrically connected between the first resistor R1 and the second resistor R2 connected in series; and a base area control-gate of the first bipolar transistor N1 and a base area control-gate electrode of the second bipolar transistor NP2 being electrically connected to an output of the amplifier K, which acts as an output of the band-gap reference source circuit and outputs a reference voltage Vref.

The foregoing control unit adopts the operational amplifier K.

The foregoing band-gap reference source circuit with the NPN-type bipolar transistor can output the reference voltage Vref with a temperature coefficient of nearly zero, and for specific reasoning thereof, reference can be made to the analysis in the fifth embodiment. Note that $\delta(V_{gd2})/\delta T < 0$, $\delta(\Delta V_{gd})/\delta T > 0$ for the NPN-type bipolar transistor is the same as that for the PNP-type bipolar transistor and therefore repeated descriptions are omitted here.

The Seventh Embodiment

Figure 21:
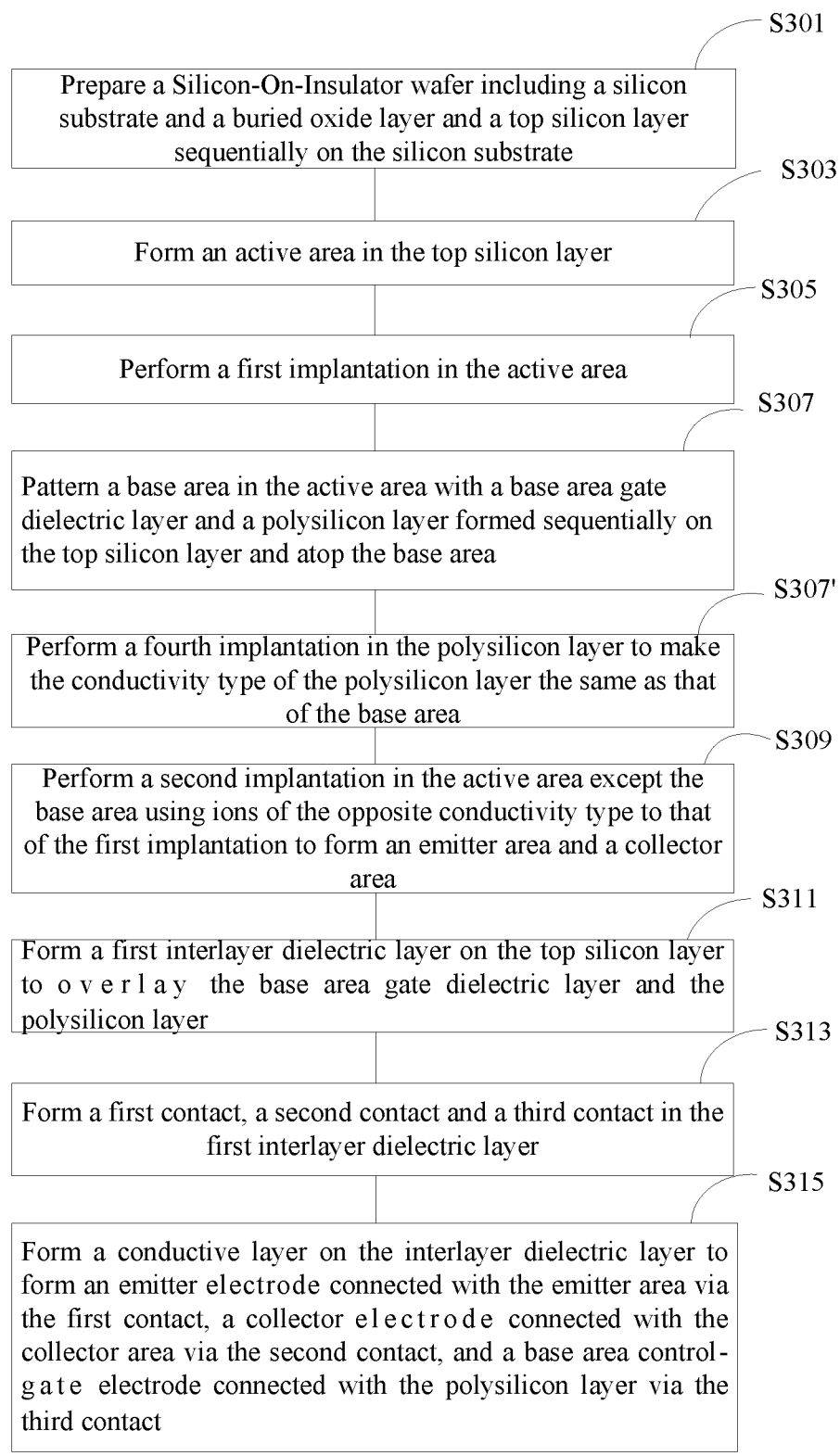
FIG. 21 is a schematic flow diagram of forming a bipolar transistor according to the sixth embodiment of the invention.

An embodiment of the invention further provides a method for fabricating a bipolar transistor, and reference is made to FIG. 21 for a specific flow thereof, which includes: step S301 where a SOI wafer is prepared which includes a silicon substrate and a BOX layer and a top silicon layer sequentially on the silicon substrate; step S303 where an active area is formed in the top silicon layer; step S305 where the first implantation is performed in the active area; step S307 where a base area is patterned in the active area, and a base area gate dielectric layer and a polysilicon layer are formed sequentially on the top silicon layer and atop the base area; step S307' where the fourth implantation is performed in the polysilicon layer to make the conductivity type of the polysilicon layer the same as that of the base area; step S309 where the second implantation is performed in the active area except the base area using ions of the opposite conductivity type to that of ions for the first implantation to form an emitter area and a collector area; step S311 where a first interlayer dielectric layer is formed on the top silicon layer to cover the base area gate dielectric layer and the polysilicon layer; step S313 where a first contact, a second contact and a third contact are formed in the first interlayer dielectric layer; and step S315 where a conductive layer is formed on the interlayer dielectric layer to form an emitter electrode connected to the emitter area via the first contact, a collector electrode connected to the collector area via the second contact and a base area control-gate electrode connected to the polysilicon layer via the third contact.

Figure 22:
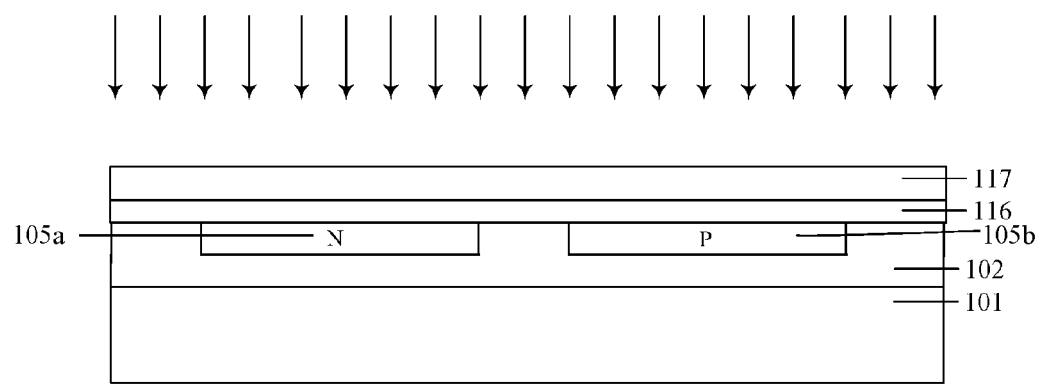
FIG. 22 is a cross-sectional view of the fourth implantation into a polysilicon layer during formation of the bipolar transistor according to the sixth embodiment of the invention.

The present embodiment is substantially the same as the foregoing method for forming a bipolar transistor except the conductivity type of the polysilicon base area control-gate 117 in the present embodiment the same as that of the base area after the fourth implantation. That is, steps S301~S315 in the present embodiment are the same as steps S101~S115 in the foregoing embodiment except the additional step S307' after the original step S107. Therefore, reference can be made to FIG. 3 to FIG. 15 in the foregoing embodiment for cross-section view of the formation method in the present embodiment except additional FIG. 22 inserted between FIG. 7 and FIG. 8, which illustrates a schematic structural diagram of performing the fourth implantation into the polysilicon layer 117 using ions of the same conductivity type as that of the base area but opposite to those of the subsequently formed emitter area and collector area.

If the bipolar transistor is of the PNP type, then ions for the fourth implantation may be n-type ions, e.g., phosphorous or arsenic.

If the bipolar transistor is of the NPN type, then ions for the fourth implantation may be p-type ions, e.g., boron or boron fluoride ions. The fourth implantation can be performed with the same energy and dosage ranges as those for heavily doped source/drain implantation of an MOS transistor and therefore can be performed concurrently with the heavily doped source/drain implantation of the MOS transistor.

After the step of the fourth implantation, the base area control-gate is patterned (by masking steps and plasma etching the material of gate dielectric layer 116 and the polysilicon layer 117) and the gate stack is formed as in FIG. 8.

Again in the present embodiment, the additional implantations on the base area and the third implantation for formation of a buffer area between the collector area and the base area can further be involved to further optimize the performance of the bipolar transistor, and reference can be made particularly to the relevant descriptions in the first embodiment and repeated descriptions thereof are omitted here.

The Eighth Embodiment

Particularly referring to FIG. 13, a bipolar transistor according to the eighth embodiment of the invention resulting from the foregoing process according to the seventh embodiment includes: a SOI wafer 100 including a silicon substrate 101 and a buried oxide layer 102 and a top silicon layer 103 sequentially on the silicon substrate 101; a base area 111a or 111b, an emitter area 120a or 120b and a collector area 119a or 119b in the top silicon layer 103, the base area 111a being between the emitter area 120a and the collector area 119a, the base area 111b being between the emitter area 120b and the collector area 119b, the conductivity type of the emitter area 120a or 120b being the same as that of the collector area 119a or 119b, and the conductivity type of the base area 111a or 111b being opposite to those of the emitter area 120a or 120b and the collector area 119a or 119b; a base area gate dielectric layer 116 on the top silicon layer 103 and atop the base area 111a or 111b; a polysilicon layer 117 on the base area gate dielectric layer 116; an emitter electrode 125a connected to the emitter area 120a via a first contact 122a, or an emitter electrode 125b connected to the emitter area 120b via a first contact 122b; and a collector electrode 126a connected with the collector area 119a via a second contact 123a, or a collector electrode 126b connected to the collector area 119b via a second contact 123b. The bipolar transistor further includes a base area control-gate electrode 127a or 127b connected to the polysilicon layer 117 via a third contact 124a or 124b. The conductivity type of the polysilicon layer is the same as that of the base area and opposite to those of the emitter area 120a or 120b and the collector area 119a or 119b.

A buffer area 114a is further included between the collector area 119a and the base area 111a, or a buffer area 114b is further included between the collector area 119b and the base area 111b, and the buffer area 114a or 114b has the same doping type as that of the collector area 119a or 119b but has a lighter doping concentration than that of the collector area 119a or 119b.

The interfaces between the buffer area 114a and the collector area 119a, between the buffer area 114b and the collector area 119b, between the emitter area 120a and the base area 111a and between the emitter area 120b and the base area 111b are angled with respect to the surface of the top silicon layer 103.

The polysilicon layer of the base area control-gate of the bipolar transistor formed in the present embodiment is doped with the same conductivity type as that of the base area, which is different from traditional doping where the conductivity type of a polysilicon gate of a traditional MOS transistor is opposite to that of a channel area. The net effect of a MOS transistor with the poly doping reversed (than conventional doping type) is a shift of the threshold voltage by one band-gap value (~1.2v). Similarly, the voltage to turn on the bipolar transistor according to the invention (a first voltage to be applied to the base area control-gate electrode) is also shifted by one band-gap (~1.2v) and the output voltage Vref of the band-gap reference source circuit (as described later in the ninth, tenth and eleventh embodiments) is also shifted by one band-gap by making the conductivity type of the polysilicon layer the same as that of the base area.

The Ninth Embodiment

An embodiment of the invention further provides a method for triggering the bipolar transistor in which the conductivity type of the polysilicon layer is the same as that of the base area according to the eighth embodiment, which includes: a first voltage is applied to the base area control-gate electrode; a second voltage is applied to the collector; and a third voltage is applied to the emitter. Minority carriers are formed at the surface of the collector area due to the electric field from the foregoing voltages, and the minority carriers are of the same type as majority carriers in the base area and flow into the base area to form GIDL current. The GIDL current continuously flow into the emitter area to forward bias the PN junction between the base area and the emitter area. The method to turn on the bipolar transistor is the same as that in the third embodiment, and therefore it is not repeated here. However, the polysilicon layer of the base area control-gate is doped oppositely to a polysilicon layer of a traditional MOS transistor (to result in an internal energy band offset of one band-gap from the base area control-gate to the collector area), and the first voltage to be applied to the base area control-gate is different from that in the third embodiment exactly by one band-gap (~1.2v).

That is, for a PNP bipolar transistor, the energy band of the N-type polysilicon layer of the base area control-gate electrode has caused band-bending and inversion-tendency of the surface of the P-type collector area (that is, the energy band of the surface of the P-type collector area is bended by approximately one energy band-gap to localize electrons on the surface of the collector area), and a voltage required on the base area control-gate electrode to trigger the formation of GIDL current (that is, the base area control-gate electrode is at a potential above that at the collector) is one band-gap (~1.2v) smaller or lower than that in the third embodiment (that is, the base area control-gate electrode is at a voltage closer to that at the collector).

For an NPN bipolar transistor, the energy band of the P-type polysilicon layer of the base area control-gate has caused band-bending and inversion-tendency of the surface of the N-type collector area (that is, the energy band of the surface of the N-type collector area is bended by approximately one energy band-gap to attract holes on the surface of the collector area), and a voltage required on the base area control-gate electrode to trigger the formation of GIDL current (that is, the base area control-gate electrode is at a potential below that at the collector) is one band-gap larger or higher than that in the third embodiment (that is, the base area control-gate electrode is at a voltage closer to that at the collector electrode).

The Tenth Embodiment

An embodiment of the invention further provides a virtual ground reference circuit with the bipolar transistor according to the eighth embodiment, which includes: a first terminal and a second terminal with a first voltage difference; a first current source with one terminal electrically connected to the first terminal; a first bipolar transistor with an emitter electrode connected to the other terminal of the first current source; a first load with one terminal electrically connected to a collector electrode of the first bipolar transistor and the other terminal electrically connected to the second terminal; a third terminal and a fourth terminal with a second voltage difference; a second current source with one terminal electrically connected to the third terminal; a second bipolar transistor with an emitter electrode connected to the other terminal of the second current source; a second load with one terminal electrically connected to a collector electrode of the second bipolar transistor and the other terminal electrically connected to the fourth terminal; a base area control-gate electrode of the first bipolar transistor and a base area control-gate electrode of the second bipolar transistor being connected to the output of the virtual ground reference circuit, and both the first bipolar transistor and the second being of the PNP type; and a control unit with a first input electrically connected to the emitter electrode of the first bipolar transistor, a second input electrically connected to the emitter of the second bipolar transistor, and an output electrically connected to the output of the virtual ground reference circuit. The control unit results in both currents at the emitter electrode and the collector electrode of the first bipolar transistor to be the same as the current output from the first current source, and similarly, both currents at the emitter electrode and the collector electrode of the second bipolar transistor to be the same as the current output from the second current source. The control unit results in both a temperature coefficient of an output voltage of the virtual ground reference circuit to be nearly zero by selecting proper magnitudes of the output current of the first current source, the output current of the second current source, the first load and the second load.

The first bipolar transistor is in the same structure as that of the second bipolar transistor, the first voltage difference is the same as the second voltage difference, the first load is a first resistor and a second resistor, and the second load is the second resistor. The first terminal and the third terminal are connected with an external voltage source (Vdd), and the second terminal and the fourth terminal are grounded.

The basic circuit of the virtual ground reference circuit is in the same construction as that of the band-gap reference source circuit in the fifth embodiment (as illustrated in FIG. 19) except the base area control-gate of an N-type polysilicon layer (of the opposite conductivity type to that of the collector area) in the PNP bipolar transistor here.

The output voltage Vref is one band-gap in the foregoing fifth embodiment, and those skilled in the art can recognize from the descriptions in the ninth embodiment of the principle on which the PNP bipolar transistor is triggered with reference to FIG. 19 that in the present embodiment the doping type of the base area control-gate is changed to be opposite to that of the collector area and the output voltage Vref is shifted toward the potential of the collector area, i.e., it drops by one band-gap (~1.2v), that is, the output voltage Vref is nearly zero. Unlike real "ground", however, this output voltage will be a stable zero voltage and therefore it can be isolated from any noise at the ground line.

The Eleventh Embodiment

An embodiment of the invention further provides a double band-gap voltage circuit with the bipolar transistor according to the eighth embodiment, which includes: a first terminal and a second terminal with a first voltage difference; a first current source with one terminal electrically connected to the first terminal; a first bipolar transistor with an emitter electrode connected to the other terminal of the first current source; a first load with one terminal electrically connected to a collector electrode of the first bipolar transistor and the other terminal electrically connected to the second terminal; a third terminal and a fourth terminal with a second voltage difference; a second current source with one terminal electrically connected to the third terminal; a second bipolar transistor with an emitter electrode connected to the other terminal of the second current source; a second load with one terminal electrically connected to a collector electrode of the second bipolar transistor and the other terminal electrically connected to the fourth terminal; a base area control-gate electrode of the first bipolar transistor and a base area control-gate electrode of the second bipolar transistor being connected and acting as an output of the double band-gap voltage circuit, and both the first bipolar transistor and the second being of the NPN type; and a control unit with a first input electrically connected to the emitter of the first bipolar transistor, a second input electrically connected to the emitter electrode of the second bipolar transistor, and an output electrically connected to the output of the double band-gap voltage circuit. The control unit results in both currents at the emitter electrode and the collector electrode of the first bipolar transistor to be the same as the current output from the first current source, and similarly, both currents at the emitter electrode and the collector electrode of the second bipolar transistor to be the same as the output from the second current source. The control unit results in a temperature coefficient of an output voltage the double band-gap voltage circuit nearly zero and the output voltage at the output of the double band-gap voltage circuit be ~2.5v (i.e. twice of silicon band-gap) by selecting magnitudes of the output current of the first current source, the output current of the second current source, the first load and the second load.

The first bipolar transistor is in the same structure as that of the second bipolar transistor, the first voltage difference is the same as the second voltage difference, the first load is a first resistor and a second resistor, and the second load is the second resistor. The first terminal and the third terminal are grounded, and the second terminal and the fourth terminal are connected to an external voltage source. The doping concentration of a polysilicon layer of the first bipolar transistor is the same as that of a polysilicon layer of the second bipolar transistor.

The basic circuit of the double band-gap voltage circuit is in the same construction as that of the band-gap reference source circuit in the sixth embodiment as illustrated in FIG. 20 except the base area control-gate of the P-type polysilicon layer (of the opposite conductivity type to that of the collector area) in the NPN bipolar transistor here.

The output voltage Vref is one band-gap in the foregoing sixth embodiment, and those skilled in the art can recognize from the descriptions in the ninth embodiment of the principle on which the NPN bipolar transistor is triggered with reference to FIG. 20 that in the present embodiment the doping type of the base area control-gate electrode is changed to be the same as that of the collector area and the output voltage Vref is shifted toward the potential of the collector area, i.e., it rises by one band-gap, that is, the output voltage Vref is twice a silicon band-gap voltage, i.e., approximately 2.5V, and can replace a conventional external voltage source at 2.5V, and this voltage is stable with a temperature coefficient of nearly zero and will never be subject to any noise.

In the foregoing fifth embodiment, the first terminal and the third terminal are connected to the same external voltage source Vdd and the second terminal and the fourth terminal are grounded. Alternatively, the first terminal and the third terminal can be connected to different external voltage sources, and the second terminal and the fourth terminal can be connected to another potential, for example, even a negative potential, as long as the voltage difference between the first terminal and the second terminal and that between the third terminal and the fourth terminal can enable the circuit to be operative. In the fifth embodiment, the amplifier is provided with its own maximum voltage source Vcc and minimum voltage source Vss, and the voltage difference between the first terminal and the second terminal and that between the third terminal and the fourth terminal are between the maximum voltage source Vcc and the minimum voltage source Vss. Alternatively, Vdd can be Vcc and Vss can be grounded. Note here the same will also hold true for the external voltage sources and the amplifiers in the other embodiments.

The bipolar transistor according to the embodiments of the invention can be applicable to the foregoing band-gap reference source circuit, virtual ground reference circuit and double band-gap voltage circuit and also to other digital circuits, e.g., an inverter, a logic gate, a Static Random Access Memory (SRAM), . . . etc.

Although the invention has been disclosed as above in connection with the preferred embodiments thereof, they are not intended to define the claims appended to the invention, and any skilled in the art can make possible variations and modifications without departing from the spirit and scope of the invention. Accordingly, the scope of the invention shall be as defined in the appended claims.

What is claimed is:

1. A method for fabricating a bipolar transistor comprising a base, an emitter, and a collector, the method comprising:
   preparing a wafer having a silicon substrate, a buried oxide layer on the silicon substrate, and a top silicon layer on the buried oxide layer;
   removing portions of the top silicon layer to provide a first active area and a second active area, contacting on the buried oxide layer;
   performing a first implantation in the first and second active areas to provide an n-type first implanation area and a p-type first implanlation area, respectively;
   forming a base area gate dielectric layer on each of the n-type first implanation area and the p-type first implanlation area, and a base area control-gate on each base area pate dielectric layer;
   performing a second implantation in each of the n-type first implanation area and the p-type first implanlation area using the base area control-gates as a mask to form a p-type emitter area and a p-type collector area, in the n-type first implanation area, and to form an n-type emitter area and an n-type collector area, in the p-type first implanlation area.

2. The method according to claim 1, further comprising:
   performing an additional implantation in a base area, which is a portion of each of the first and second active areas, corresponding to the base area gate dielectric layer, using ions of the same conductivity type as that of the first implantation.

3. The method according to claim 1, further comprising:
   performing a third implantation in the p-type emitter area, the p-type collector area, the n-type emitter area, and the n-type collector area using ions of a same conductivity type as that of the second implantation in an angled direction with respect to a surface of the semiconductor substrate to form a buffer area connecting a base area, corresponding to the base area gate dielectric layer, and the collector area after performing the second implantation and before forming the first interlayer dielectric layer.

4. The method according to claim 3, wherein the base area control-gate is made of polysilicon, and the method further comprises:
   doping the base area control-gate such that the conductivity type of the doped base area control-gate is opposite to that of the base area.

5. The method according to claim 1, wherein the wafer is a Silicon-On-Insulator wafer.

6. A method for fabricating a bipolar transistor comprising a base, an emitter, and a collector, the method comprising:
   preparing a wafer having a silicon substrate, and a buried oxide layer and a top silicon layer sequentially formed on the silicon substrate;
   forming an active area in the top silicon layer and performing a first implantation in the active area;
   patterning a base area in the active area and sequentially forming a base area pate dielectric layer and a base area control-gate on the top silicon layer and over the base area;
   performing a second implantation in the active area except the base area using ions of an opposite conductivity type to that of the first implantation to form an emitter area and a collector area;
   forming a first interlayer dielectric layer on the top silicon layer to cover the base area gate dielectric layer and the base area control-gate; forming a first contact, a second contact, and a third contact in the first interlayer dielectric layer; and
   forming a conductive layer on the first interlayer dielectric layer to form an emitter electrode connected to the emitter area via the first contact, a collector electrode connected to the collector area via the second contact, and a base area control-gate electrode connected to the base area control-gate via the third contact,
   wherein when a first, second, and third voltage is respectively applied to the emitter electrode, the collector electrode, and the base area control-gate electrode, a current flow induced by minority carriers flows from the collector into the base as a result of the bias between the third voltage and the second voltage, the current or a portion thereof continues to flow from the base into the emitter as a result of the bias between the first voltage and the third voltage.

7. The method according to claim 1, wherein:
   the bipolar transistor is an NPN transistor, the base is a P-type base, the collector is an N-type collector, and the emitter is an N-type emitter.

8. The method according to claim 1, wherein:
   the bipolar transistor is a PNP transistor, the base is an N-type base, the collector is a P-type collector, and the emitter is a P-type emitter.

9. The method according to claim 1, after performing the second implantation further, further comprising:
   forming a first interlayer dielectric layer at least on remaining top silicon layer and on the base area control-gate; and
   forming a conductive layer on the first interlayer dielectric layer, the conductive layer including:
      an emitter electrode connected to the emitter area through the first interlayer dielectric layer via a first contact,
      a collector electrode connected to the collector area through the first interlayer dielectric layer via a second contact, and
      a base area control-gate electrode connected to the base area control-gate through the first interlayer dielectric layer via a third contact.

10. The method according to claim 1, after removing portions of the top silicon layer to provide the first active area and the second active area and before performing the first implantation, further comprising:
    filling a shallow trench, formed between the first and second active areas and on the buried oxide layer, with a dielectric material.

11. The method according to claim 6, further comprising:
    performing an additional implantation in the base area using ions of the same conductivity type as that of the first implantation.

12. The method according to claim 6, further comprising:
performing a third implantation in the active area except the base area using ions of the same conductivity type as that of the second implantation in an angled direction with respect to a surface of the semiconductor substrate to form a buffer area connecting the base area and the collector area after performing the second implantation and before forming the first interlayer dielectric layer.

13. The method according to claim 12, wherein the base area control-gate is of polysilicon, and the method further comprises:
doping the base area control-gate such that the conductivity type of the doped base area control-gate is opposite to that of the base area.

14. The method according to claim 6, wherein the wafer is a Silicon-On-Insulator wafer.

15. The method according to claim 6, wherein:
the bipolar transistor is an NPN transistor, the base is a P-type base, the collector is an N-type collector, and the emitter is an N-type emitter.

16. The method according to claim 6, wherein:
the bipolar transistor is a PNP transistor, the base is an N-type base, the collector is a P-type collector, and the emitter is a P-type emitter.

* * * * *